US012702071B2

(12) United States Patent
     Huo

(10) Patent No.: US 12,702,071 B2
(45) Date of Patent: Aug. 4, 2026

(54) DISPLAY PANEL AND DISPLAY DEVICE

(71) Applicant: TIANMA ADVANCED DISPLAY TECHNOLOGY INSTITUTE (XIAMEN) CO., LTD., Xiamen (CN)

(72) Inventor: Sitao Huo, Xiamen (CN)

(73) Assignee: TIANMA ADVANCED DISPLAY TECHNOLOGY INSTITUTE (XIAMEN) CO., LTD., Xiamen (CN)

( * ) Notice: Subject to any disclaimer, the term of this patent is extended or adjusted under 35 U.S.C. 154(b) by 501 days.

(21) Appl. No.: 18/473,291

(22) Filed: Sep. 25, 2023

(65) Prior Publication Data

US 2024/0014187 A1     Jan. 11, 2024

(30) Foreign Application Priority Data

Jun. 29, 2023   (CN) .......................... 202310782339.0

(51) Int. Cl.
    *H01L 25/075*      (2006.01)
    *G02B 5/04*        (2006.01)
    *H01L 33/58*       (2010.01)
    *H10H 20/855*      (2025.01)
    *H10W 90/00*       (2026.01)

(52) U.S. Cl.
    CPC ............ *H10W 90/00* (2026.01); *G02B 5/045* (2013.01); *H10H 20/855* (2025.01)

(58) Field of Classification Search
    CPC ...... H01L 25/0753; H01L 33/58; G02B 5/045
    See application file for complete search history.

(56) References Cited

U.S. PATENT DOCUMENTS

| | | | |
|---|---|---|---|
| 10,527,886 B1 | 1/2020 | Lin et al. | |
| 11,782,189 B2 * | 10/2023 | He ......................... G06F 1/1637 |
| | | | 361/679.02 |
| 2023/0117666 A1 * | 4/2023 | Ma .................... G02F 1/133607 |
| | | | 345/55 |
| 2024/0280850 A1 * | 8/2024 | Xi ..................... G02F 1/136286 |

FOREIGN PATENT DOCUMENTS

| | | | | |
|---|---|---|---|---|
| CN | 109031784 A | | 12/2018 | |
| CN | 109754711 A | | 5/2019 | |
| CN | 1144442370 A | | 5/2022 | |
| CN | 116096136 A | * | 5/2023 | |
| CN | 118778282 A | * | 10/2024 | ............. G02B 30/36 |

* cited by examiner

*Primary Examiner* — Joseph L Williams
(74) *Attorney, Agent, or Firm* — Kilpatrick Townsend & Stockton LLP

(57)          ABSTRACT

A display panel and a display device are provided. The display panel includes a substrate, multiple light emitting elements, and multiple prism structures. The prism structure includes multiple sub-structures. An orthographic projection of the sub-structure on the substrate at least partially surrounds that of the light emitting element on the substrate. The sub-structure has a first inclined surface toward the light emitting element, and the sub-structures include a first sub-structure and a second sub-structure. In a first direction, the first sub-structure and the second sub-structure have different distances from the light emitting element, and have different included angles between first inclined surfaces of the sub-structures and a direction perpendicular to a plane in which the substrate is located. The first direction is parallel to a plane in which the substrate is located.

20 Claims, 15 Drawing Sheets

1

DISPLAY PANEL AND DISPLAY DEVICE

The present application claims priority to Chinese Patent Application No. 202310782339.0, titled "DISPLAY PANEL AND DISPLAY DEVICE", filed on Jun. 29, 2023 with the China National Intellectual Property Administration, which is incorporated herein by reference in its entirety.

FIELD

The present application relates to the field of electronic products, and in particular relates to a display panel and a display device.

BACKGROUND

Light emitting diodes (LED) are widely used in fields such as lighting and display due to the advantages of small size, low power, long service life and high brightness.

However, a display panel is prone to halos due to the limitation on light pattern distribution of the light emitting diodes, which affects the display effect of the display panel.

Therefore, there is a need for a new display panel and display device.

SUMMARY

A display panel and a display device are provided according to embodiments of the present disclosure, in which prism structures are provided to avoid the generation of a halo, improving the display effect of the display panel.

In one embodiment, a display panel is provided according to an embodiment of the present disclosure. The display panel includes: a substrate; multiple light emitting elements arranged on one side of the substrate; and multiple prism structures arranged on a light emitting side of the light emitting element. The prism structure includes multiple sub-structures. An orthographic projection of each of the sub-structures on the substrate at least partially surrounds an orthographic projection of the light emitting element on the substrate. Each of the sub-structures has a first inclined surface facing towards the light emitting element. The sub-structures include a first sub-structure and a second sub-structure. A distance between the first sub-structure and the light emitting element in a first direction is different from a distance between the second sub-structure and the light emitting element in the first direction. An included angle between the first inclined surface of the first sub-structure and a direction perpendicular to a plane in which the substrate is located in the first direction is different from an included angle between the first inclined surface of the second sub-structure and the direction perpendicular to the plane in which the substrate is located in the first direction. The first direction is parallel to the plane in which the substrate is located.

In one embodiment, a display device is provided according to an embodiment of the present disclosure. The display device includes the display panel according to any one of the above embodiments.

Compared with the conventional technology, the display panel according to the embodiment of the present disclosure includes the substrate, the light emitting elements, and the multiple prism structures. The light emitted from the light emitting element is refracted at the first inclined surface of the sub-structure of the prism structure when the light is irradiated onto the sub-structure, changing an emission path of the light emitting element, changing the incidence angle of the light emitted from the light emitting element on the display surface of the display panel, avoiding total reflection, and enabling the light emitted from the light emitting element to be emitted from the display surface of the display panel, which avoids the generation of the halo, and increases the amount of emitted light and improves the efficiency of light emitting. Further, the distance between the first sub-structure and the light emitting element in the first direction is different from the distance between the second sub-structure and the light emitting element in the first direction, therefore emission angles of the light emitted from the light emitting element which is irradiated onto the first sub-structure and the second sub-structure are different. In this embodiment, the incidence angles and corresponding refraction angles of the light emitting element at the first inclined surface of the first sub-structure and the first inclined surface of the second sub-structure can be changed by adjusting the included angle between the first inclined surface of the first sub-structure and the direction perpendicular to a plane where the substrate is located and the included angle between the first inclined surface of the second sub-structure and the direction perpendicular to a plane where the substrate is located, i.e., by setting the included angle between the first inclined surface of the first sub-structure and the direction perpendicular to a plane where the substrate is located and the included angle between the first inclined surface of the second sub-structure and the direction perpendicular to a plane where the substrate is located to be different, to change the incidence angle of the light emitted from the light emitting element on the display surface of the display panel, ensuring that light emitted from both the first sub-structure and the second sub-structure can be emitted from the display surface of the display panel, avoiding the generation of a halo, and improving the display effect of the display panel.

BRIEF DESCRIPTION OF THE DRAWINGS

In order to clearly illustrate the embodiments of the present disclosure, the accompanying drawings used in the description of the embodiments are briefly described below. It is apparent that the accompanying drawings in the following description only illustrate the embodiments of the present disclosure.

DETAILED DESCRIPTION OF THE EMBODIMENTS

Features and exemplary embodiments of the present disclosure are described in detail hereafter. Specific details are provided in the following detailed description for a thorough understanding of the present disclosure. Embodiments of the present disclosure can be implemented without some of the specific details. The description of the embodiments below is only intended to provide a better understanding of the present disclosure by illustrating the examples of the present disclosure.

It should be noted that a relation term such as "first" and "second" herein is only used to distinguish one entity or operation from another entity or operation, and does not necessarily require or imply that there is an actual relation or sequence between these entities or operations. In some embodiment, terms of "include", "comprise" or any other variants thereof are intended to be non-exclusive. Therefore, a process, method, article or device including a series of elements includes not only the elements but also other elements that are not explicitly listed, or also includes the elements inherent for the process, method, article or device. Unless expressively limited otherwise, the elements limited by "comprising/including . . . " does not exclude existence of another identical element in such process, method, article or device.

In the conventional technology, LED (Light Emitting Diode) may be used as a light source of a display panel to achieve light emitting display. However, due to the difference between the light pattern distribution of the LED, LCD and OLED, the light intensity of the light pattern distribution of the LED is stronger in a side view angle than in a vertical view angle, and light emitted laterally has a large component, and the light emitted laterally is totally reflective in an emission interface of the display panel, such as a cover, resulting in certain angles of light not being able to be emitted, and thus forming a transverse light waveguide within a transparent medium layer, generating a halo, and affecting the display quality and the display effect.

In order to solve the above problem, in the display panel according to the embodiments of the present disclosure, prism structures are provided to avoid the generation of a halo, improving the display effect of the display panel.

For a better understanding of the present disclosure, the display panel and the display device according to the embodiments of the present disclosure are described in detail below in conjunction with FIGS. 1 to 26.

Figure 1:
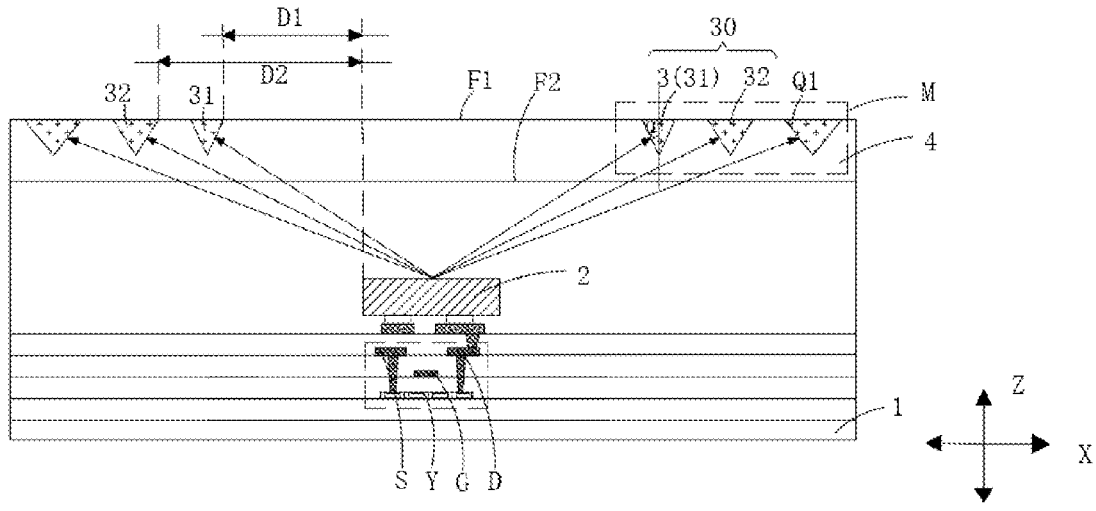
FIG. 1 is a structural view of film layers of a display panel according to an embodiment of the present disclosure.
Figure 2:
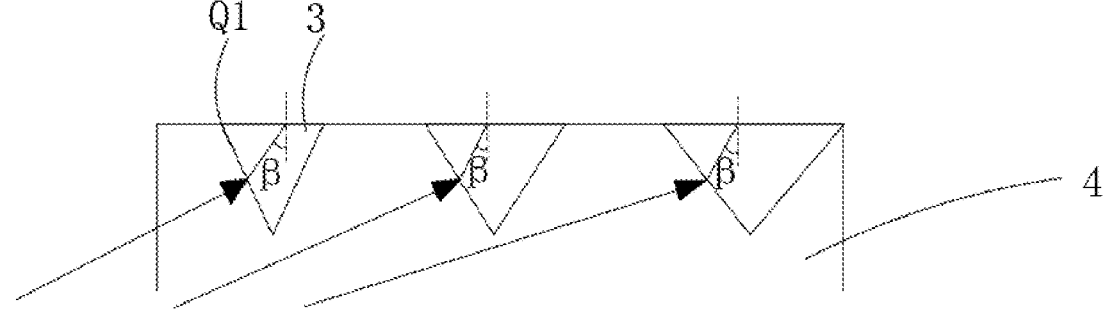
FIG. 2 is a partially enlarged view of the film layers at M in FIG. 1.
Figure 3:
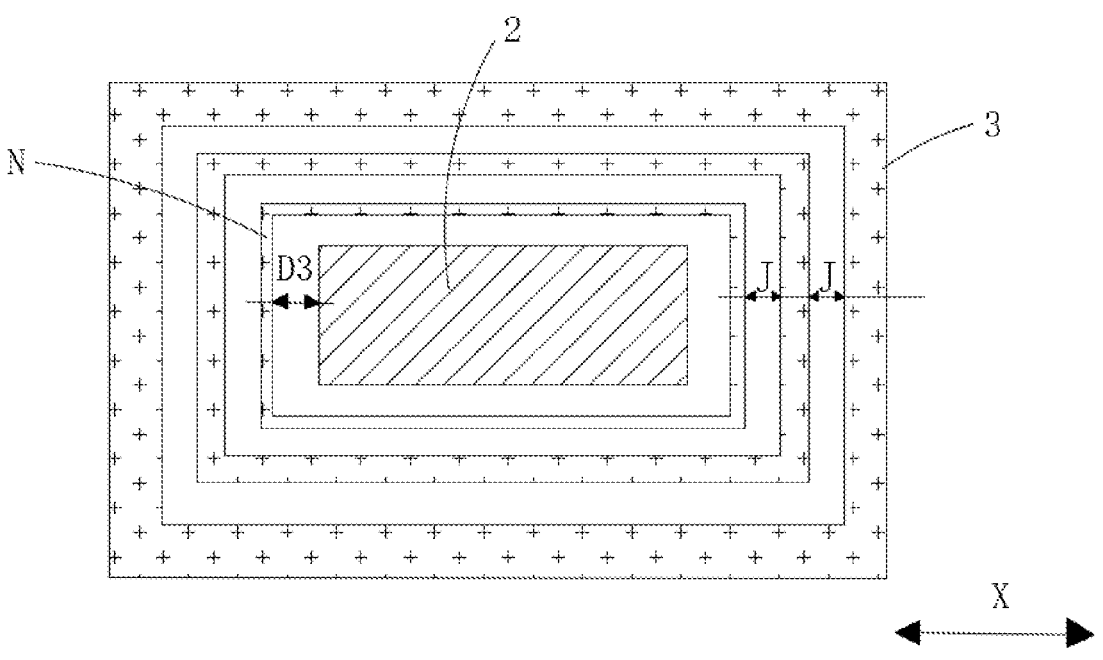
FIG. 3 is a top view of a prism structure according to an embodiment of the present disclosure.

With reference to FIGS. 1 to 3 in combination, FIG. 1 is a structural view of film layers of a display panel according to an embodiment of the present disclosure; FIG. 2 is a partially enlarged view of the film layers at M in FIG. 1; and FIG. 3 is a top view of a prism structure according to an embodiment of the present disclosure.

A display panel is provided according to an embodiment of the present disclosure. The display panel includes: a substrate 1; multiple light emitting elements 2 arranged on one side of the substrate 1; and multiple prism structures 30 arranged on a light emitting side of the light emitting element 2. The prism structure 30 includes multiple sub-structures 3. An orthographic projection of the sub-structure 3 on the substrate 1 at least partially surrounds an orthographic projection of the light emitting element 2 on the substrate 1. The sub-structure 3 has a first inclined surface Q1 facing towards the light emitting element 2. The multiple sub-structures 3 include a first sub-structure 31 and a second sub-structure 32. A distance between the first sub-structure 31 and the light emitting element 2 in a first direction X is different from a distance between the second sub-structure 32 and the light emitting element 2 in the first direction X. An included angle between the first inclined surface Q1 of the first sub-structure 31 and a direction Z perpendicular to a plane in which the substrate 1 is located in the first direction X is different from an included angle between the first inclined surface Q1 of the second sub-structure 32 and the direction Z in the first direction X. The first direction X is parallel to the plane in which the substrate 1 is located.

The display panel according to the embodiment of the present disclosure includes the substrate 1, the light emitting elements 2, and the prism structures 30. The light emitted from the light emitting element 2 is refracted at the first inclined surface Q1 of the sub-structure 3 of the prism structure 30 when the light is irradiated onto the sub-structure 3, changing an emission path of the light emitting element 2, changing the incidence angle R of the light emitted from the light emitting element 2 on the display surface of the display panel, avoiding total reflection, and enabling the light emitted from the light emitting element 2 to be emitted from the display surface of the display panel, which avoids the generation of the halo, and increases the amount of light emitted and improves the efficiency of light emitting. Further, the distance between the first sub-structure 31 and the light emitting element 2 in the first direction X is different from the distance between the second sub-structure 32 and the light emitting element 2 in the first direction X, emission angles of the light emitted from the light emitting element 2 which is irradiated onto the first sub-structure 31 and the second sub-structure 32 are different. In this embodiment, the incidence angles and corresponding refraction angles of the light emitting element 2 at the first inclined surface Q1 of the first sub-structure 31 and the first inclined surface Q1 of the second sub-structure 32 can be changed by adjusting the included angle between the first inclined surface Q1 of the first sub-structure 31 and the direction Z perpendicular to a plane where the substrate 1 is located and the included angle between the first inclined surface Q1 of the second sub-structure 32 and the direction Z, i.e., by setting the included angle between the first inclined surface Q1 of the first sub-structure 31 and the direction Z to be different from the included angle between the first inclined surface Q1 of the second sub-structure 32 and the direction Z, to change the incidence angle R of the light emitted from the light emitting element 2 on the display surface of the display panel, ensuring that light emitted from both the first sub-structure 31 and the second sub-structure 32 can be emitted from the display surface of the display panel, avoiding the generation of a halo, and improving the display effect of the display panel.

In this embodiment, each prism structure 30 may include two, three or more sub-structures 3, and the number of the sub-structures 3 may be selected based on parameters of the light emitted from the light emitting element 2, for example, an irradiation range or a wavelength of the emitted light, or the width of the sub-structure 3.

The orthographic projection of the sub-structure 3 on the substrate 1 at least partially surrounding the orthographic projection of the light emitting element 2 on the substrate 1 indicates that the sub-structure 3 is arranged at the periphery of the light emitting element 2. The orthographic projection of the sub-structures 3 on the substrate 1 may be of a closed-ring shape, and all sub-structures 3, as a whole, surround the orthographic projection of the light emitting element 2 on the substrate 1. The orthographic projection of the sub-structures 3 on the substrate 1 may be multiple spaced apart individuals, each of which is arranged on the outside of the orthographic projection of the light emitting element 2 on the substrate 1.

The first inclined surface Q1 of the sub-structure 3 may be understood as a side surface, facing towards the light emitting element 2, of the sub-structure 3. The first inclined surface Q1 is inclined at an angle with respect to the direction Z perpendicular to the plane in which the substrate 1 is located. The first inclined surface Q1 may be a flat surface or a curved surface.

The distance between the first sub-structure 31 and the light emitting element 2 in the first direction X is different from the distance between the second sub-structure 32 and the light emitting element 2 in the first direction X. The first direction X is parallel to the plane in which the substrate 1 is located. According to the actual situation, the first direction X may be a direction from the orthographic projection of the light emitting element 2 on the substrate 1 to the prism structure 30, or a direction in which a symmetry axis of the prism structures 30 extends, and so on.

In this embodiment, the light emitting element 2 may be an LED (light emitting diode) chip structure, for example, a Micro LED (micro light emitting diode), which has a size less than 50 microns, or the light emitting element 2 may be a Mini-LED (small light emitting diode), which has a size less than 100 microns.

The LED chip structure includes a horizontal structure and a vertical structure. The embodiments of the present disclosure are applicable to LEDs with a normal structure, a vertical structure and a flip-flop structure.

In an embodiment, the display panel further includes an array layer arranged between the substrate 1 and the light emitting element 2. The array layer includes a pixel circuit which includes a transistor. The transistor may be a thin film transistor including an active layer Y, a gate G, a source S, and a drain D. The material of the drain D, the source S, and the gate G may include one or a combination of molybdenum, titanium, aluminum, copper and the like. The gate G of the thin-film transistor is typically used to receive a control signal to cause the thin-film transistor to be turned on or cut off under the control of the control signal. One of the source S or the drain D of the thin film transistor is electrically connected to the light emitting element 2 to control the normal light emission of the light emitting element 2.

Figure 4:
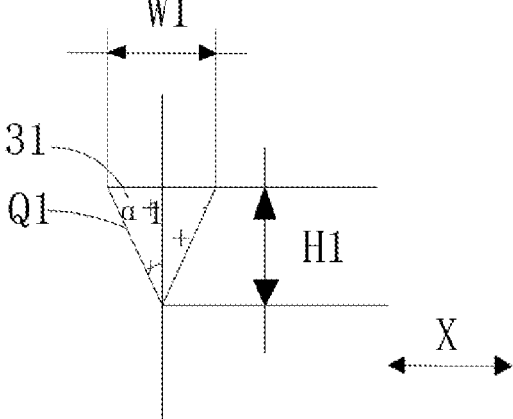
FIG. 4 is a schematic structural view of a first sub-structure of a prism structure according to an embodiment of the present disclosure.
Figure 5:
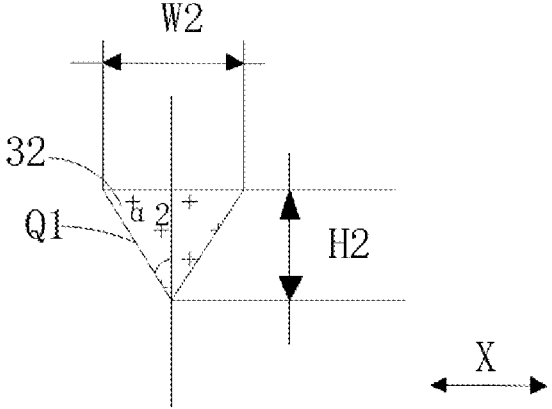
FIG. 5 is a schematic structural view of a second sub-structure of a prism structure according to an embodiment of the present disclosure.

With reference to FIGS. 1, 4, and 5, FIG. 4 is a schematic structural view of a first sub-structure 31 of a prism structure 30 according to an embodiment of the present disclosure; and FIG. 5 is a schematic structural view of a second sub-structure 32 of a prism structure 30 according to an embodiment of the present disclosure.

In some embodiments, the distance between the first sub-structure 31 and the light emitting element 2 in the first direction X is a first distance D1, the distance between the second sub-structure 32 and the light emitting element 2 in the first direction X is a second distance D2. The included angle α between the first inclined surface Q1 of the first sub-structure 31 and the direction Z perpendicular to a plane in which the substrate 1 is located in the first direction X is a first included angle α1. The included angle α between the first inclined surface Q1 of the second sub-structure 32 and the direction Z perpendicular to a plane in which the substrate 1 is located in the first direction X is a second included angle α2. The first distance D1 is less than the second distance D2, and the first included angle α1 is less than the second included angle α2.

It should be understood that in this embodiment, the first distance D1 is less than the second distance D2, i.e., the second sub-structure 32 is further from the light emitting element 2 relative to the first sub-structure 31 in the first direction X. It is found that a greater included angle α between the first inclined surface Q1 of the sub-structure 3 and the direction Z perpendicular to a plane in which the substrate 1 is located leads to a less incidence angle β of the light emitted from the light emitting element 2 on the display surface of the display panel. The condition for total reflection is that the incidence angle β of the light emitted from the light emitting element 2 on the display surface of the display panel is greater than a critical incidence angle, which is a constant. By reducing the incidence angle β of the light emitted from the light emitting element 2 on the display surface of the display panel, the critical incidence angle can be avoided to be exceeded, the light emitted from the light emitting element 2 can be emitted from the display surface of the display panel, which avoids the generation of the halo and increases the amount of emitted light, and improves the efficiency of light emitting.

With reference to FIGS. 4 and 5, in some embodiments, the width of the first sub-structure 31 in the first direction X is a first width W1 and the width of the second sub-structure 32 in the first direction X is a second width W2. The first width W1 is less than or equal to the second width W2.

Since the first included angle α1 is less than the second included angle α2, the first inclined surface Q1 of the second sub-structure 32 is more gently inclined relative to the first inclined surface Q1 of the first sub-structure 31. In this embodiment, it can be enabled that the first included angle α1 is less than the second included angle α2 by adjusting the width of the first sub-structure 31. The width of the sub-structure 3 may be understood as the maximum length of the first sub-structure 31 in the first direction X. In this case, the first direction X may be a direction from the light emitting element 2 to the prism structure 30. The position of the sub-structure 3 corresponding to the width of the sub-structure 3 depends on the structural shape of the sub-structure 3. For example, in a case that the cross section of each of the first sub-structure 31 and the second sub-structure 32 in a plane perpendicular to the substrate 1 is of an inverted triangle shape, the width of each of the first sub-structure 31 and the second sub-structure 32 may refer to the length of the bottom side of the inverted triangle. In a case that the cross section of each of the first sub-structure 31 and the second sub-structure 32 on the plane perpendicular to the substrate 1 is of a semicircle shape, the width of each of the first sub-structure 31 and the second sub-structure 32 may refer to the diameter of the semicircle.

Figure 6:
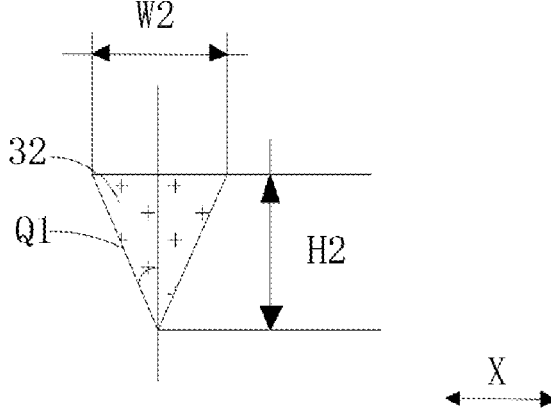
FIG. 6 is a schematic structural view of a second sub-structure of a prism structure according to another embodiment of the present disclosure.

With reference to FIGS. 4, 5, and 6, FIG. 6 is a schematic structural view of a second sub-structure 32 of a prism structure 30 according to another embodiment of the present disclosure. In some embodiments, a depth of the first sub-structure 31 is a first depth H1, a depth of the second sub-structure 32 is a second depth H2, and the first depth H1 is less than or equal to the second depth H2.

It should be understood that, the included angles α between the first inclined surfaces Q1 of the first sub-structure 31 and the second sub-structure 32 and the direction Z perpendicular to a plane in which the substrate 1 is located may be adjusted by adjusting the depths of the first sub-structure 31 and the second sub-structure 32, in addition to by adjusting the widths of the first sub-structure 31 and the second sub-structure 32 as described above. For example, the first depth H1 may be less than the second depth H2, as shown in FIG. 6. In addition, the first width W1 may be less than or equal to the second width W2. In one embodiment, the first width W1 may be less than the second width W2, and the first depth H1 may be less than or equal to the second depth H2.

In an embodiment, for ease of preparation, the first width W1 may be less than the second width W2 and the first depth H1 may be equal to the second depth H2.

With reference to FIG. 3, in some embodiments, the distance J between each two adjacent ones of the multiple sub-structures 3 of the prism structure 30 in the first direction X is equal. On the one hand, the uniformity of the sub-structures 3 can be improved for ease of arrangement, and on the other hand, the uniformity of the light exited from the sub-structures 3 can be improved to ensure the display effect. In this embodiment, the first direction X may be a direction from the light emitting element 2 to the prism structure 30, or in some embodiments, the first direction X may be a direction in which the symmetry axis of the sub-structure 3 extends, and so on.

A greater distance between the sub-structure 3 and the light emitting element 2 in the first direction X leads to a less emission angle of the light emitted from the light emitting element 2 which is irradiated onto the sub-structure 3. That is, a less angle between the emitted light and the plane in which the substrate 1 is located results in a greater possibility that the sub-structure 3 that is further from the light emitting element 2 is blocked by a previous sub-structure 3, which affects the utilization rate of the sub-structures 3.

Figure 7:
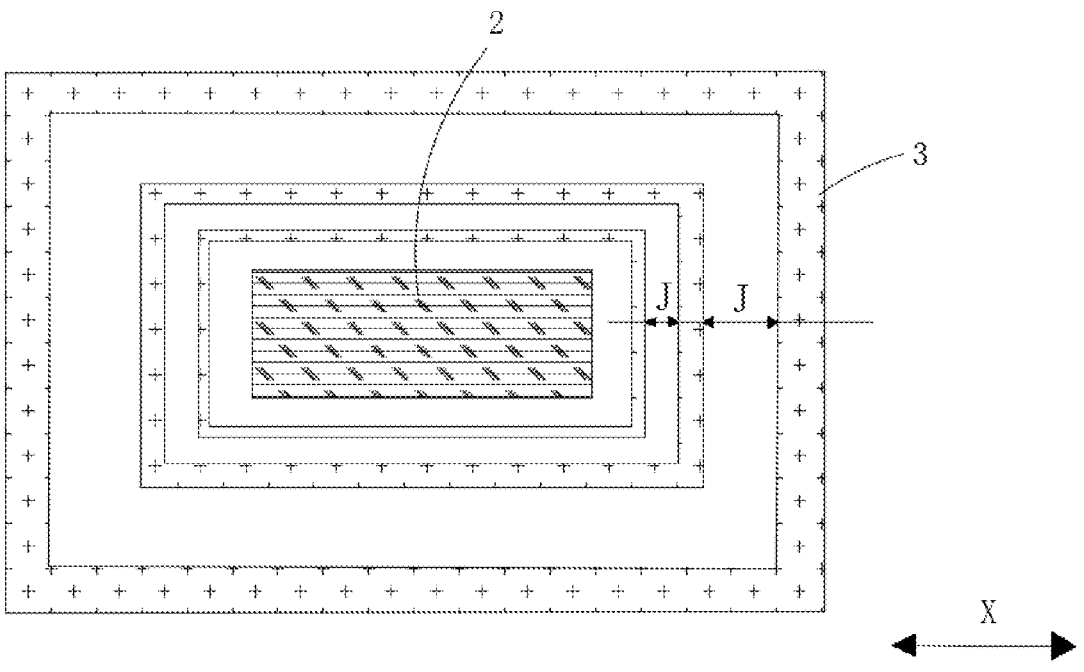
FIG. 7 is a top view of a prism structure according to another embodiment of the present disclosure.

In order to solve the above problem, reference is made to FIG. 7, which is a top view of a prism structure 30 according to another embodiment of the present disclosure. In this embodiment of the present disclosure, the distance J between each two adjacent ones of the sub-structures 3 of the prism structure in the first direction X increases sequentially along a direction away from the light emitting element 2. The sub-structure 3 that is further from the light emitting element 2 can be avoided from being blocked by sequentially increasing the distance J between the two adjacent sub-structures 3, effectively improving the utilization rate of the sub-structures 3.

In some embodiments, the sub-structure 3, adjacent to the light emitting element 2, of the sub-structures 3 of the prism structure 30 is an inner sub-structure N3. The distance between the inner sub-structure N3 and the light emitting element 2 in the first direction X is greater than or equal to 0.5 millimeters.

The thickness of the film layer between the inner sub-structure N3 and the light emitting element 2 is relatively constant, generally ranging from 0.5 millimeters to 0.8 millimeters, the refractive index of the material of the prism structure 30 ranges from 1.3 to 1.5. In a case that the prism structure 30 is arranged in a transparent material such as a cover plate 4, the refractive index of the cover plate 4 ranges from 1.5 to 1.6, the principle of total reflection is that "in a case that light emitted from the medium 1 with a refractive index n1 into the medium 2 with a refractive index n2 undergoes total reflection, the critical incidence angle C satisfies that SinC is equal to n2/n1", for example, when the light is emitted from the cover plate 4, if the refractive index of the glass of the cover plate 4 is 1.5 and the refractive index of the air is 1.0, in this case, the total reflection angle of the interface is about 42 degrees. Therefore, based on the range of the refractive index of the cover plate 4 being 1.5 to 1.6, the thickness of the film layer between the inner sub-structure N3 and the light emitting element 2, and the angle between the first inclined surface Q1 of the inner sub-structure N3 and the direction Z perpendicular to the plane in which the substrate 1 is located, it can be determined that, the distance between the inner sub-structure N3 and the light emitting element 2 in the first direction X is required to be greater than or equal to 0.5 millimeters, the emission angle of the light emitted from the inner sub-structure N3 on the display surface of the display panel is less than the critical incidence angle, avoiding the total reflection of the light emitted from the inner sub-structure N3 on the display surface of the display panel, avoiding the generation of a halo, and improving the display effect of the display panel.

A result, that the included angle between the first inclined surface Q1 and the direction Z that is perpendicular to the plane in which the substrate 1 is located ranges from degrees to 60 degrees, is measured experimentally and is obtained in combination with the refractive index of the material of the prism structure 30, the refractive index of the cover plate 4, and the formula for calculating the critical incidence angle C. The value of the included angle between the first inclined surface Q1 and the direction Z that is perpendicular to the plane in which the substrate 1 is located is required to be determined based on the refractive index of the material of the prism structure 30, the refractive index of the cover plate 4, and other relevant parameters, and it is only necessary to ensure that the incidence angle R of the light emitted from the light emitting element 2 on the display surface of the display panel is less than the critical incidence angle, the light emitted from the first sub-structure 31 and the second sub-structure 32 can be emitted from the display surface of the display panel.

Figure 8:
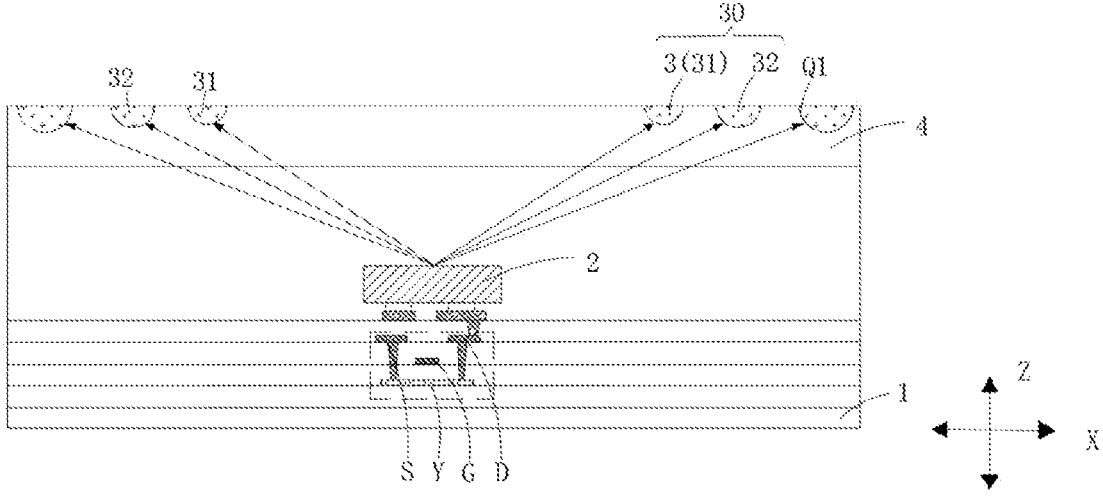
FIG. 8 is a structural view of film layers of a display panel according to another embodiment of the present disclosure.

With reference to FIGS. 3 and 8, FIG. 8 is a structural view of film layers of a display panel according to another embodiment of the present disclosure. In some embodiments, a cross-section of each of the sub-structures 3 increases sequentially along a direction away from the substrate 1. The shape of the cross-section of the sub-structure 3 affects the shape and the inclined angle of the first inclined surface Q1. The first inclined surface Q1 affects the refracted light path of the light emitting element 2 in the sub-structure 3, and the emission angle of light emitted from the light emitting element 2 on the display surface of the display panel. It is found that in a case that the cross-section of each of the sub-structures 3 increases sequentially, on the one hand, it is enabled to effectively reduce the emission angle of the light emitted from the light emitting element 2 on the display surface of the display panel, and on the other hand, it is also enabled to reduce the incidence angle of the light emitted from the light emitting element 2 on the first inclined surface Q1, to avoid total reflection occurring at the first inclined surface Q1, and ensuring that the light emitted from the light emitting element 2 can be emitted from the sub-structure 3.

In an embodiment, a cross-section of each of the sub-structures 3 on a plane perpendicular to the substrate 1 is of at least one of an inverted triangle shape, a semicircle shape and an inverted trapezoid shape. Depending on different shapes of the cross-section of the sub-structure 3 on the plane perpendicular to the substrate 1, the first inclined surface Q1 corresponds to different sides of the shape of the cross-section of the sub-structure 3. For example, in a case that the cross-section of the sub-structure 3 on the plane perpendicular to the substrate 1 is of an inverted triangle shape, as shown in FIG. 3, the first inclined surface Q1 corresponds to an inclined side, facing towards the light emitting element 2, of the inverted triangle; or in the case where the cross-section of the sub-structure 3 on the plane perpendicular to the substrate 1 is of a semi-circular shape, as shown in FIG. 8, the first inclined surface Q1 corresponds to the arc, facing towards the light emitting element 2, of the semi-circular shape; or in the case where the cross-section of the sub-structure 3 on the plane perpendicular to the plane in which the substrate 1 is located is of an inverted trapezoid shape, the first inclined surface Q1 corresponds to a leg, facing towards the light emitting element 2, of the inverted trapezoid. It is apparent that, the cross-section of the sub-structure 3 on the plane perpendicular to the substrate 1 may be of other shapes.

Figure 9:
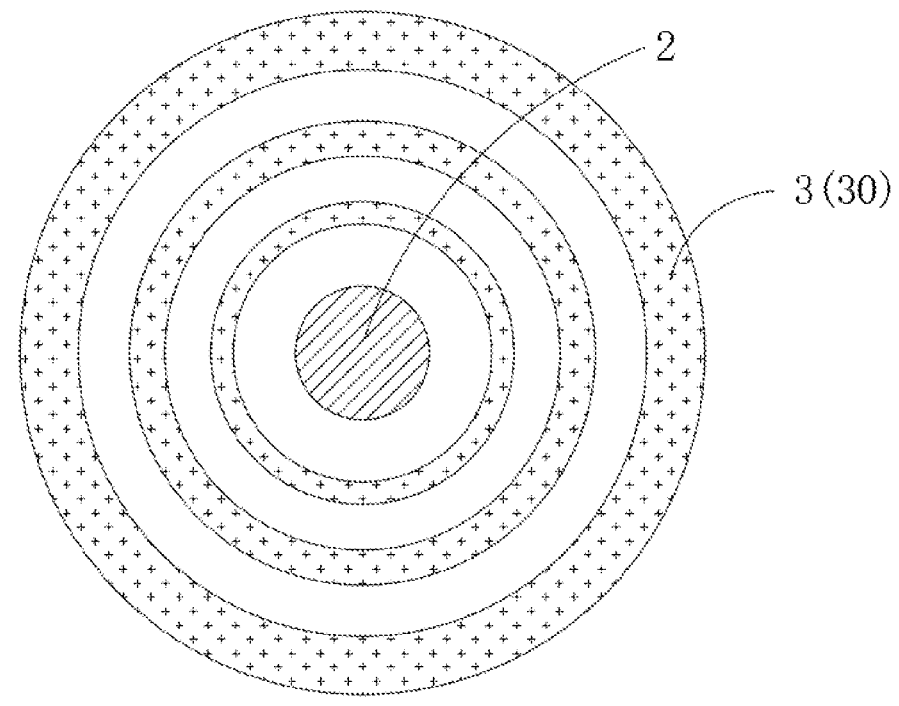
FIG. 9 is a top view of a prism structure according to yet another embodiment of the present disclosure.
Figure 10:
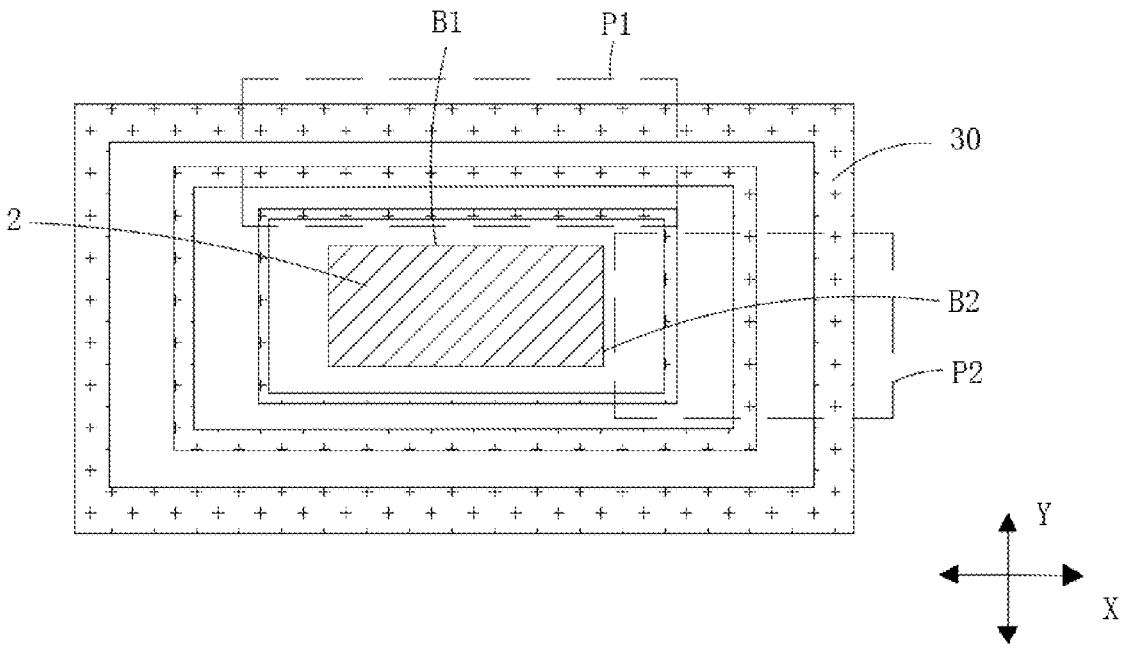
FIG. 10 is a top view of a prism structure according to yet another embodiment of the present disclosure.

With reference to FIG. 9 or FIG. 10, FIG. 9 is a top view of a prism structure according to yet another embodiment of the present disclosure; and FIG. 10 is a top view of a prism structure 30 according to yet another embodiment of the present disclosure. In some embodiments, the shape of an outer edge of the orthographic projection of the sub-structure 3 on the substrate 1 is similar to the shape of the orthographic projection of the light emitting element 2 on the substrate 1.

Similar shapes may be understood as two orthographic projections having the same shape and proportional corresponding sides. For example, the outer edge of the orthographic projection of each sub-structure 3 on the substrate 1 is of a rectangle shape, and the rectangles corresponding to the sub-structures are of different sizes and are proportional in terms of the lengths of the sides. In one embodiment, in a case that the outer edge of the orthographic projection of each sub-structure 3 on the substrate 1 is of a circle shape, the circles corresponding to the sub-structures may be concentrically arranged and the radii of the circles are different.

It should be noted that in a case that the outer edge of the orthographic projection of each sub-structure 3 on the substrate 1 is of a rectangular shape, correspondingly, the orthographic projection of the sub-structures 3 on the substrate 1 as a whole is of a rectangular ring structure, as shown in FIG. 10. In a case that the outer edge of the orthographic projection of each sub-structure 3 on the substrate 1 is of a circular shape, correspondingly, the orthographic projection of the sub-structures 3 on the substrate 1 as a whole is of a circular ring structure, as shown in FIG. 9.

In an embodiment, the orthographic projection of the sub-structure 3 on the substrate 1 is of a closed-ring shape, and surrounds the orthographic projection of the light emitting element 2 on the substrate 1. That is, there is provided a sub-structure 3 in each direction of an outer peripheral side of the light emitting element 2, to ensure that the emission path of the light emitted from the light emitting element 2 in each direction can be adjusted through the sub-structure 3.

For example, the orthographic projection of the sub-structure 3 on the substrate 1 may be of a rectangular ring structure, a circular ring structure and other regular shapes, or may be of a four-leaf clover shape, a " 凸 " shape and other shapes according to the actual needs.

Due to the limitation to the shape of the light emitting element 2, the amount of the light emitted from the light emitting element 2 may be different in different directions, and the prism structure 30 may be arranged correspondingly. With reference to FIG. 10, in some embodiments, the light emitting element 2 includes a first side B1 extending in the first direction X and a second side B2 extending in a second direction Y. The length of the first side B1 is greater than the length of the second side B2. The first direction X and the second direction Y intersect with each other. The prism structure 30 includes a first region P1 adjacent to the first side B1 and a second region P2 adjacent to the second side B2. A distribution density of ones, arranged in the first region P1, of the sub-structures 3 is greater than a distribution density of ones, arranged in the second region P2, of the sub-structures 3.

It should be noted that since the length of the first side B1 of the light emitting element 2 is greater than the length of the second side B2, the amount of the light emitted from the light emitting element 2 in a direction in which the first side B1 is located is correspondingly greater than the amount of the light emitted in a direction in which the second side B2 is located. In this embodiment, the distribution density of the sub-structures 3 in the first region P1 is set to be greater than the distribution density of the sub-structures 3 in the second region P2, the light path of light emitted from the light emitting element 2 in the direction in which the first side B1 is located can be adjusted in a larger degree through the sub-structures 3 in the first region P1, to ensure that the light emitted from the light emitting element 2 in the first direction X and the second direction Y is enabled to be refracted by the sub-structures 3, and is enabled to be emitted from the display surface of the display panel, which improves the uniformity of the display effect of the display panel in the first direction X and the second direction Y.

In this embodiment, the distribution density of the sub-structures 3 in the first region P1 may be understood as the number of the sub-structures 3 per unit area in the first region P1, which may be adjusted based on parameters such as the size of the spacing between adjacent sub-structures 3 or the width of a single sub-structure 3 in the first region P1.

Figure 11:
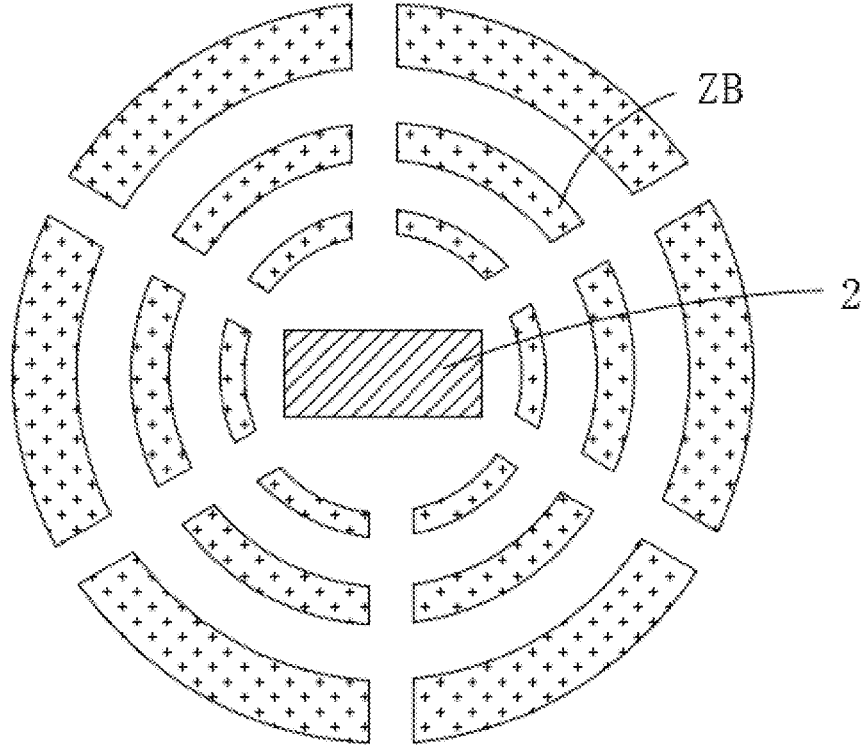
FIG. 11 is a top view of a prism structure according to yet another embodiment of the present disclosure.
Figure 12:
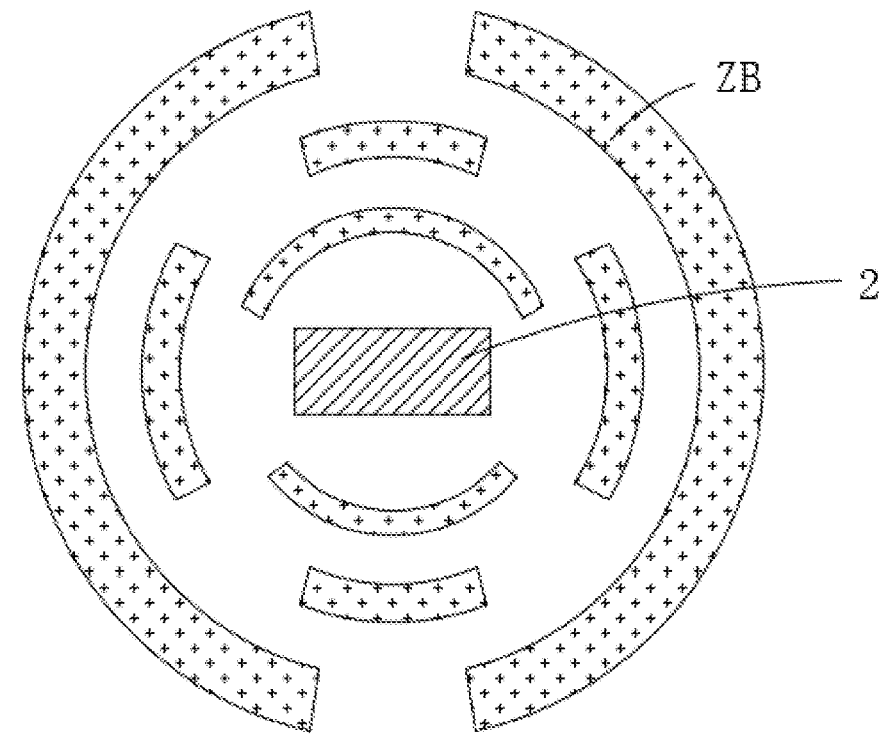
FIG. 12 is a top view of a prism structure according to yet another embodiment of the present disclosure.

In addition to the above sub-structures 3, the orthographic projection of which on the substrate 1 is of a closed-ring shape, the sub-structures 3 may also be of a discontinuous structure to improve the light transmittance effect of the display panel. With reference to FIG. 11 or FIG. 12, FIG. 11 is a top view of a prism structure 30 according to yet another embodiment of the present disclosure; and FIG. 12 is a top view of a prism structure according to yet another embodiment of the present disclosure. In an embodiment, the sub-structure 3 includes multiple sub-sections ZB spaced apart. Orthographic projections of the sub-sections ZB on the substrate 1 are symmetrically arranged about a center of the orthographic projection of the light emitting element 2 on the substrate 1.

It should be understood that the orthographic projections of the sub-sections ZB on the substrate 1 being symmetrically arranged about the center of the orthographic projection of the light emitting element 2 on the substrate 1 is provided for the case that the prism structure 30 is distributed around one light emitting element 2, and the light emission of the light emitted from the light emitting element 2 on the sub-sections ZB is uniform, which improves the display effect.

In this embodiment, the orthographic projection of the sub-section ZB on the substrate 1 may be of a rectangle shape, a curved ring structure, a trapezoid shape, and the like, which may be selected based on the shape of the light emitting element 2 and the arrangement of the light emitting element 2. The sub-sections ZB may be arranged along a rectangular trajectory, a circular trajectory, or the like.

Referring to FIG. 12, in an embodiment, the sub-sections ZB of different sub-structures 3 are at least partially non-overlapped in a direction from the center of the light emitting element 2 to the sub-structures 3. That is, the sub-sections ZB of different sub-structures 3 are at least partially staggered, to receive the light emitted from the light emitting element 2 in different directions, the light emitted from the light emitting element 2 in different directions are refracted on the sub-sections ZB, to change the light path, increasing the utilization rate of the sub-sections ZB. In addition, the light emitted from the light emitting element 2 in different directions can be refracted on the sub-sections ZB, which increases the amount of light refracted on the sub-sections ZB, ensuring that more light emitted from the light emitting element 2 can be emitted from the display surface of the display panel, which not only avoids the generation of halo, but also increases the amount of emitted light and enhances the efficiency of light emitting.

In order to ensure that the prism structure 30 has an effect of changing the light path of the light emitted from the light emitting element 2, with reference to FIGS. 3, 7, 9, 10, 11, and 12, in some embodiments, the orthographic projections of the sub-structures 3 of one prism structure 30 on the substrate 1 surround the orthographic projection of one light emitting element 2 on the substrate 1. That is, the prism structure 30 and the light emitting element 2 are provided in one-to-one correspondence, and one prism structure 30 is provided above the outer peripheral side of each light emitting element 2, to ensure that the light emitted from the light emitting elements 2 does not interfere with each other.

Figure 13:
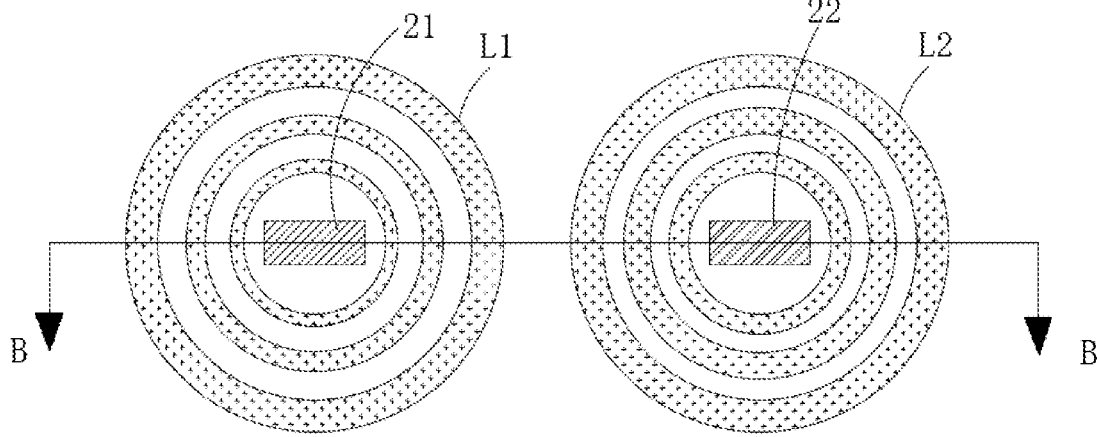
FIG. 13 is a top view of two adjacent prism structures according to an embodiment of the present disclosure.
Figure 14:
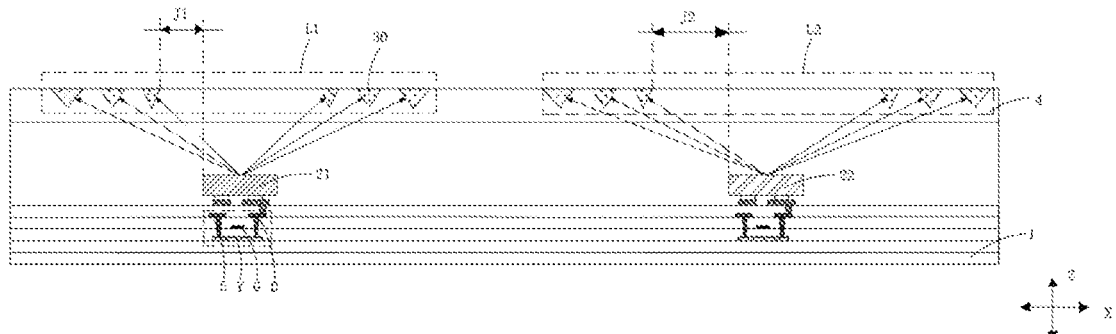
FIG. 14 is a structural view of film layers at B-B in FIG. 13 according to an embodiment of the present disclosure.

With reference to FIGS. 13 and 14, FIG. 13 is a top view of two adjacent prism structures 30 according to an embodiment of the present disclosure; and FIG. 14 is a structural view of film layers at B-B in FIG. 13 according to an embodiment of the present disclosure. In some embodiments, the light emitting elements 2 include a first light emitting element 21 and a second light emitting element 22. A wavelength of light emitted from the first light emitting element 21 is greater than a wavelength of the light emitted from the second light emitting element 22. The prism structure 30 surrounding the first light emitting element 21 is a first prism structure L1, and the prism structure 30 surrounding the second light emitting element 22 is a second prism structure L2. In the first direction X, a spacing between the first prism structure L1 and the first light emitting element 21 is a first spacing J1, a spacing between the second prism structure L2 and the second light emitting element 22 is a second spacing J2, and the first spacing J1 is less than the second spacing J2.

In this embodiment, the light emitting elements 2 usually emit red light, blue light, or green light, the wavelength of the red light is greater than the wavelength of the green light, and the wavelength of the green light is greater than the wavelength of the blue light, therefore the first light emitting element 21 and the second light emitting element 22 in this embodiment may be a red light emitting element 2 and a green light emitting element 2 respectively, or may be a red light emitting element 2 and a blue light emitting element 2 respectively, or may be a green light emitting element 2 and a blue light emitting element 2 respectively.

It should be understood that a greater wavelength corresponds to a less refractive index, and the wavelength of the light emitted from the first light emitting element 21 is greater than the wavelength of the light emitted from the second light emitting element 22. That is, in the same medium, the refractive index of the light emitted from the first light emitting element 21 is less than the refractive index of the light emitted from the second light emitting element 22. A less wavelength corresponds to a less critical angle of total reflection and total reflection is more likely to occur. That is, compared with the first prism structure L1, the light emitted from the second prism structure L2 is more likely to undergo total reflection on the display surface of the display panel.

In order to avoid total reflection of the light emitted from the second prism structure L2 on the display surface of the display panel, it is found that a greater spacing between the prism structure 30 and the light emitting element 2 in the first direction X leads to a less incidence angle β of the light emitted from the prism structure 30 on the display surface of the display panel, and total reflection is less prone to occur. Therefore, in the present embodiment, the first spacing J1 is set to be less than the second spacing J2, that is, the spacing between the second prism structure L2 and the second light emitting element 22 in the first direction X is increased, to reduce the incidence angle β of the light emitted from the second prism structure L2 on the display surface of the display panel, effectively avoiding the occurrence of total reflection, and thus avoiding the generation of a halo.

In this embodiment, the spacing between the first prism structure L1 and the first light emitting element 21 in the first direction X is the first spacing J1, which may be understood as the spacing between a sub-structure 3, that is closest to the first light emitting element 21, of the first prism structure L1 and the first light emitting element 21. Similarly, the spacing between the second prism structure L2 and the second light emitting element 22 in the first direction X is the second spacing J2, which may be understood as the spacing between a sub-structure 3, that is closest to the second light emitting element 22, of the second prism structure L2 and the second light emitting element 22.

Figure 15:
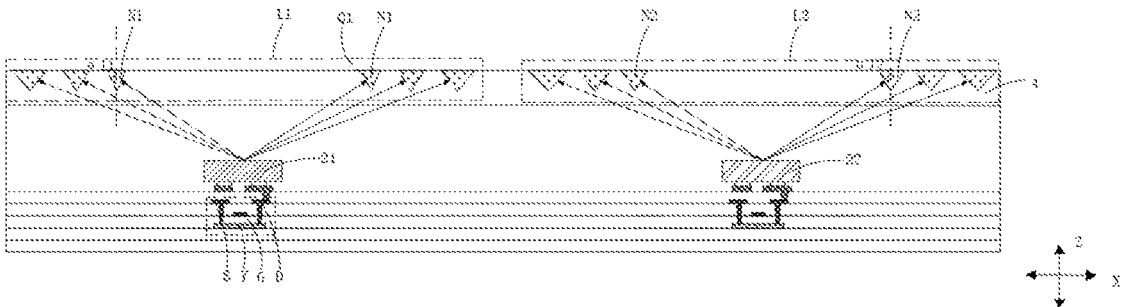
FIG. 15 is a structural view of film layers at B-B in FIG. 13 according to another embodiment of the present disclosure.

With reference to FIGS. 13 and 15, FIG. 15 is a structural view of film layers at B-B in FIG. 13 according to another embodiment of the present disclosure. In some embodiments, the light emitting elements 2 include a first light emitting element 21 and a second light emitting element 22. The wavelength of light emitted from the first light emitting element 21 is greater than the wavelength of light emitted from the second light emitting element 22. A prism structure 30 surrounding the first light emitting element 21 is a first prism structure L1, and a prism structure 30 surrounding the second light emitting element 22 is a second prism structure L2. A sub-structure 3, adjacent to the first light emitting element 21, of the sub-structures 3 of the first prism structure L1 is a first inner sub-structure N1. A sub-structure 3, adjacent to the second light emitting element 22, of the sub-structures 3 of the second prism structure L2 is a second inner sub-structure N2.

The first inner sub-structure N1 may be understood as a sub-structure 3, that is closest to the first light emitting element 21, of the sub-structures 3 of the first prism structure L1 in the first direction X. The first direction X may be a direction that is parallel to the plane in which the substrate 1 is located and is directed to the first prism structure L1 from the orthographic projection of the first light emitting element 21 on the substrate 1. Similarly, the second inner sub-structure N2 may be understood as a sub-structure 3, closest to the second light emitting element 22, of the sub-structures 3 of the second prism structure L2 in the first direction X.

In this embodiment, an included angle $\alpha$ between the first inclined surface Q1 of the first inner sub-structure N1 and the direction Z perpendicular to a plane in which the substrate 1 is located in the first direction X is a first inner included angle $\alpha$11. An included angle $\alpha$ between the first inclined surface Q1 of the second inner sub-structure N2 and the direction Z perpendicular to a plane in which the substrate 1 is located in the first direction is a second inner included angle $\alpha$12. The first inner included angle $\alpha$11 is less than the second inner included angle $\alpha$12.

Compared with the first inner sub-structure N1, the light emitted by the second light emitting element 22 from the second inner sub-structure N2 corresponds to a less critical angle on the display surface of the display panel, and is more likely to undergo total reflection.

A greater included angle $\alpha$ between the first inclined surface Q1 of the sub-structure 3 and the direction Z perpendicular to the plane in which the substrate 1 is located leads to a less incidence angle $\beta$ of the light emitted from the light emitting element 2 on the display surface of the display panel. Therefore, in the embodiment of the present disclosure, the incidence angle $\beta$ of the light emitted by the second light emitting element 22 from the second inner sub-structure N2 on the display surface of the display panel is reduced by limiting the first inner included angle $\alpha$11 to be less than the second inner included angle $\alpha$12, effectively avoiding the occurrence of total reflection and thus avoiding the generation of a halo.

Figure 16:
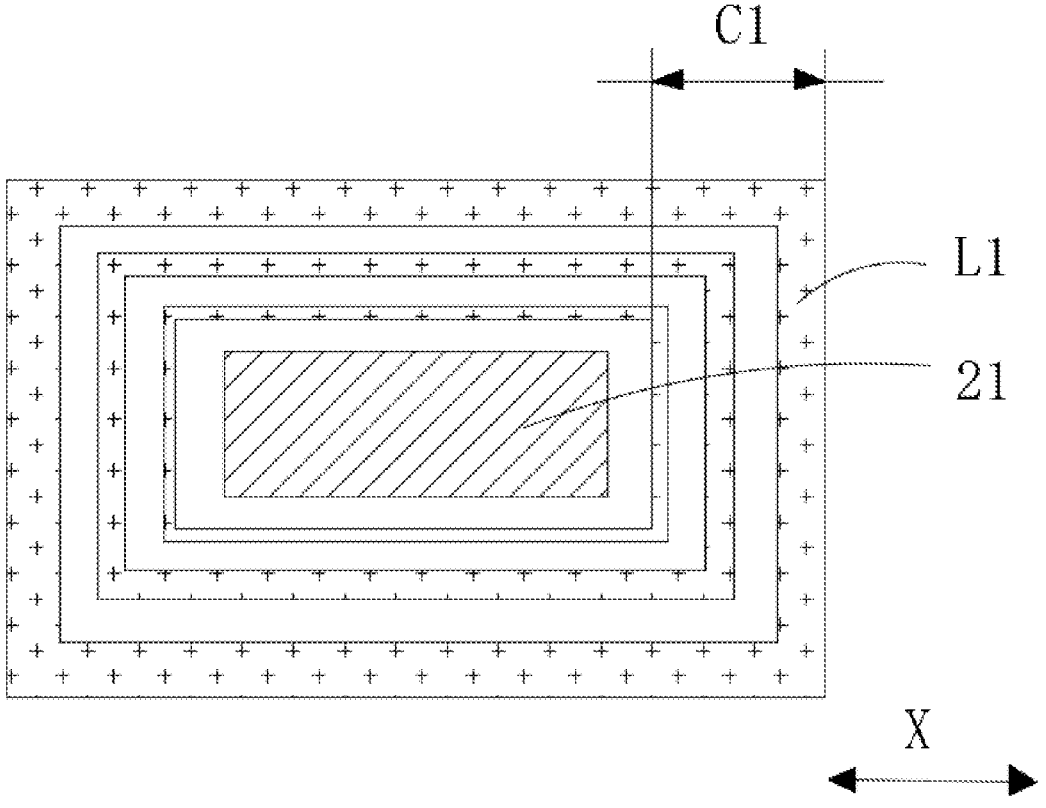
FIG. 16 is a top view of a prism structure according to yet another embodiment of the present disclosure.
Figure 17:
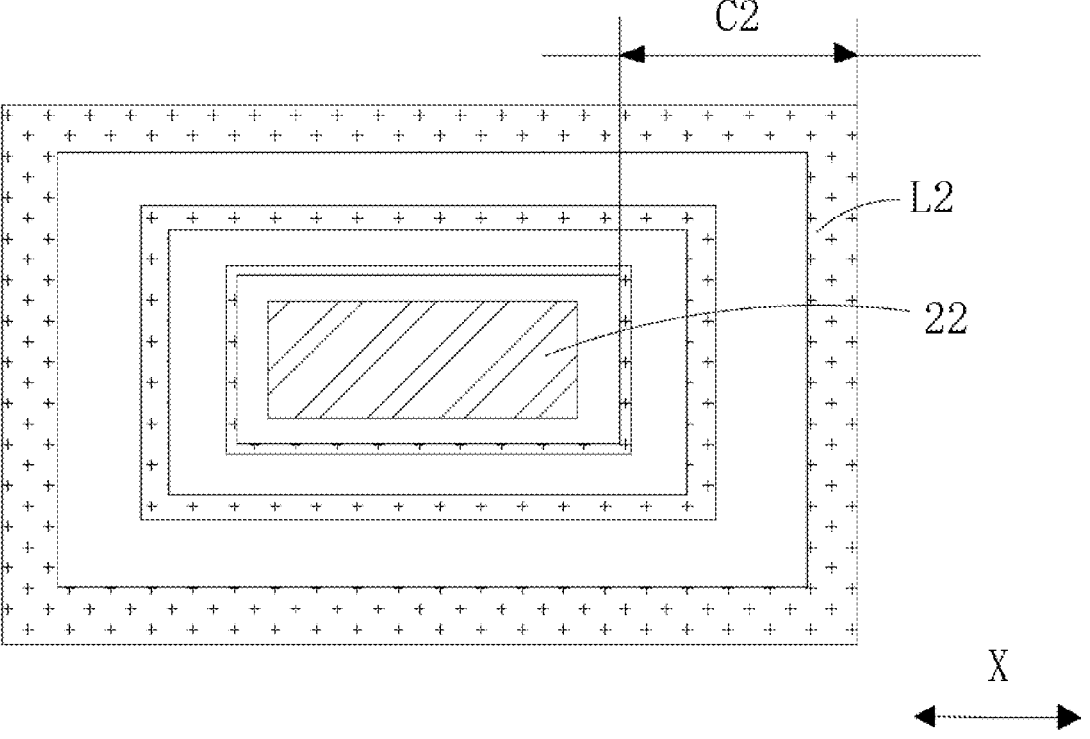
FIG. 17 is a top view of a prism structure according to yet another embodiment of the present disclosure.

Referring to FIGS. 16 and 17, FIG. 16 is a top view of a prism structure 30 according to yet another embodiment of the present disclosure; and FIG. 17 is a top view of a prism structure 30 according to yet another embodiment of the present disclosure. In some embodiments, the light emitting elements 2 include a first light emitting element 21 and a second light emitting element 22. A wavelength of the light emitted from the first light emitting element 21 is greater than a wavelength of light emitted from the second light emitting element 22. A prism structure 30 surrounding the first light emitting element 21 is a first prism structure L1, and a prism structure 30 surrounding the second light emitting element 22 is a second prism structure L2. On one side of the light emitting element 2, the first prism structure L1 is arranged in a first arrangement length C1 in the first direction X and the second prism structure L2 is arranged in a second arrangement length C2 in the first direction X. The first arrangement length C1 is less than the second arrangement length C2.

It should be noted that the first direction X may be a direction that is parallel to a plane in which the substrate 1 is located and is directed to the first prism structure L1 from the orthographic projection of the first light emitting element 21 on the substrate 1. The arrangement length may be understood as a distance between a sub-structure 3 closest to the light emitting element 2 and a sub-structure 3 furthest from the light emitting element 2 of the same prism structure 30 in the first direction X.

Since the critical angle of the light emitted by the second light emitting element 22 from the second prism structure L2 on the display surface of the display panel is less to the critical angle of the light emitted by the second light emitting element 22 from the first prism structure L1 on the display surface of the display panel, total reflection is more likely to occur for the second prism structure L2. Therefore, in the present embodiment, the light path of light emitted from the second light emitting element 22 may be adjusted in a larger degree through the second prism structure L2 by increasing the second arrangement length C2 the second arrangement length C2 is less than the first arrangement length C1, to reduce the incidence angle $\beta$ of the light emitted from the second prism structure L2 on the display surface of the display panel, effectively avoiding total reflection, and thus avoiding the generation of a halo.

Figure 18:
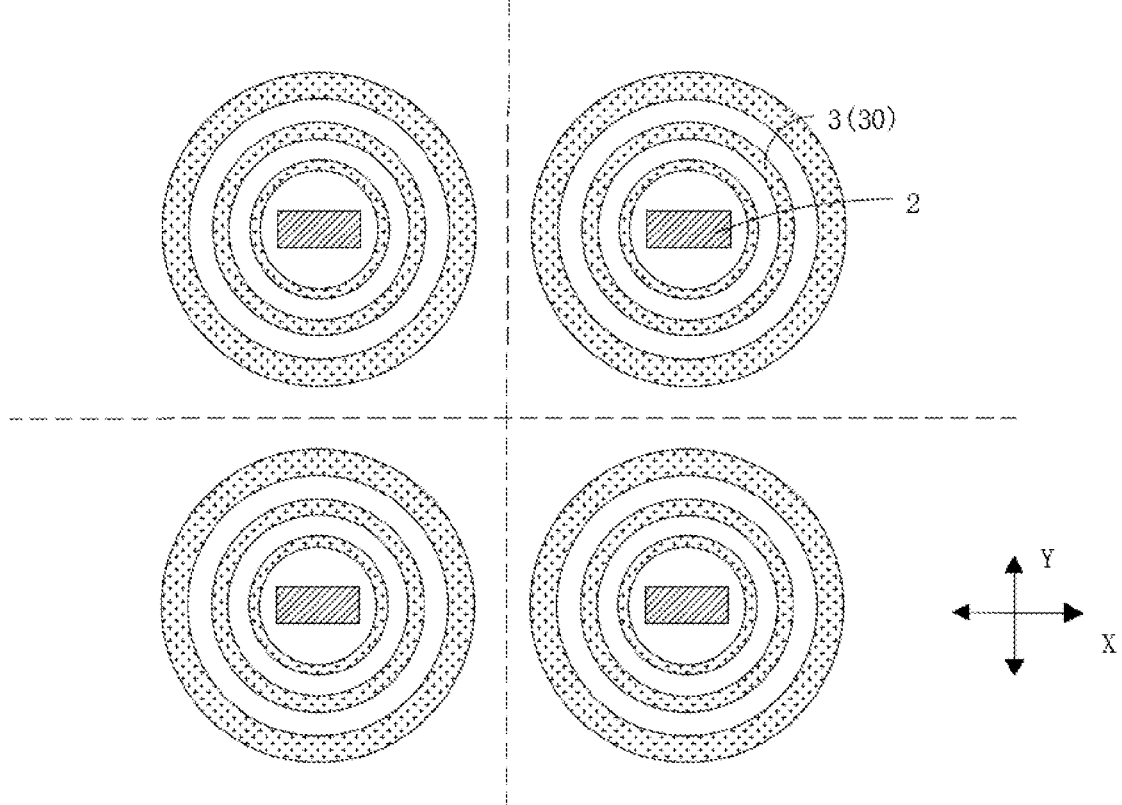
FIG. 18 is a schematic view showing the arrangement of prism structures according to an embodiment of the present disclosure.

With reference to FIG. 18, FIG. 18 is a schematic view showing the arrangement of prism structures 30 according to an embodiment of the present disclosure. In some embodiments, the sub-structures 3 of two adjacent prism structures 30 are symmetrically arranged about a middle line between two light emitting elements 2 surrounded by the two adjacent prism structures 30.

It should be noted that the middle line in the present embodiment may be understood as a line segment, the distances from which to the centers of two adjacent light emitting elements 2 are equal to each other, in a direction in which the light emitting elements 2 are arranged. For example, in a case that the light emitting elements 2 are arranged in the first direction X, the middle line is a line segment extending along a direction perpendicular to the first direction X. In one embodiment, in a case that the light emitting elements 2 are arranged in the second direction Y, the middle line is a line segment extending along a direction perpendicular to the second direction Y. In an embodiment, the first direction X and the second direction Y are perpendicular to each other.

The sub-structures 3 of the two adjacent prism structures 30 are symmetrically arranged about a middle line between two light emitting elements 2 surrounded by two adjacent prism structures, to improve the uniformity of the light emitted from the prism structures 30 corresponding to the light emitting elements 2, improving the display effect.

Figure 19:
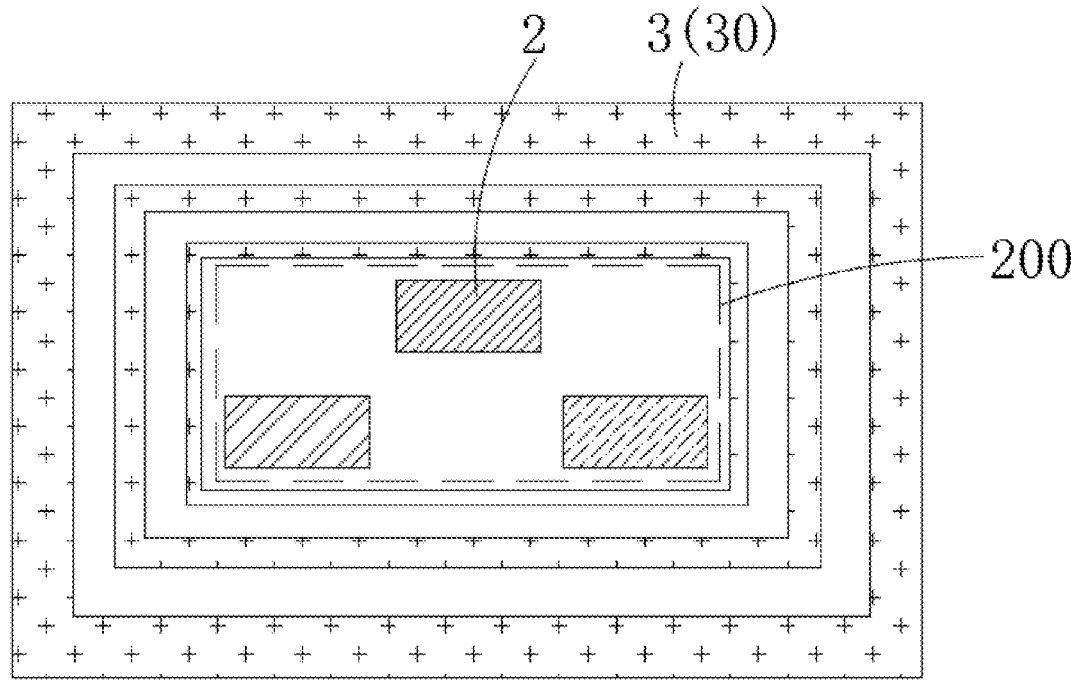
FIG. 19 is a top view of a prism structure according to yet another embodiment of the present disclosure.
Figure 20:
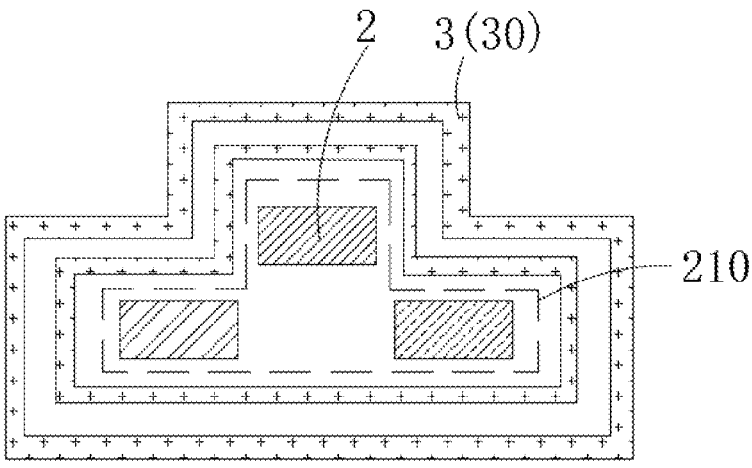
FIG. 20 is a top view of a prism structure according to yet another embodiment of the present disclosure.
Figure 21:
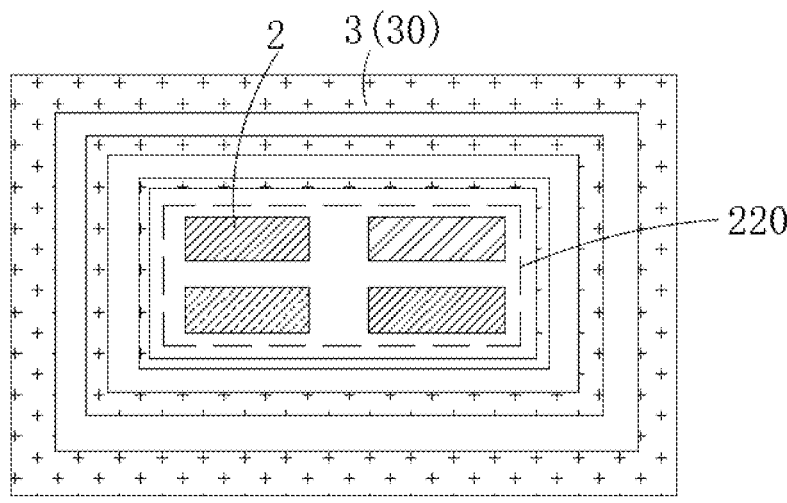
FIG. 21 is a top view of a prism structure according to yet another embodiment of the present disclosure.

With reference to FIGS. 19 to 21, FIG. 19 is a top view of a prism structure 30 according to yet another embodiment of the present disclosure; FIG. 20 is a top view of a prism structure 30 according to yet another embodiment of the present disclosure; and FIG. 21 is a top view of a prism structure 30 according to yet another embodiment of the present disclosure. In some embodiments, at least two light emitting elements 2 emitting the light with different colors form a light emitting group 200. The orthographic projection of each sub-structure 3 of one prism structure 30 on the substrate 1 surrounds an orthographic projection of at least one light emitting group 200 on the substrate 1.

In this embodiment, one prism structure 30 may be corresponding to at least two light emitting elements 2, to reduce the number of the required prism structures 30 and reduce the space occupied by the prism structures 30, facilitating preparation and reducing the production cost.

It is usually necessary for the light emitted from the light emitting elements 2 emitting red, blue, and green light to cooperate with each other and to be mixed to form white light. In this embodiment, each light emitting group 200 may include one light emitting element 2 emitting red light, one light emitting element 2 emitting blue light, and one light emitting element 2 emitting green light, which facilitates the preparation, while further facilitating the mixing of the light emitted from the light emitting elements 2 to ensure the display effect of the display panel.

According to actual needs, the orthographic projections of the sub-structures 3 of one prism structure 30 on the substrate 1 may surround the orthographic projection of one light emitting group 200 on the substrate 1, or may surround the orthographic projections of two or more light emitting groups 200 on the substrate 1.

With reference to FIGS. 20 to 21, in some embodiments, the light emitting groups 200 include a first light emitting group 210 and a second light emitting group 220. A connection line between centers of the light emitting elements 2 in the first light emitting group 210 has a different shape from that of a connection line between centers of the light emitting elements 2 in the second light emitting group 220. An orthographic projection of the sub-structure 3 of a prism structure 30 corresponding to the first light emitting group 210 on the substrate 1 has a different shape from that of an orthographic projection of the sub-structure 3 of a prism structure 30 corresponding to the second light emitting group 220 on the substrate 1.

It should be understood that, in order to improve the refracting effect of the prism structure 30 on the light emitted from the light emitting elements 2 within the first light emitting group 210 and the second light emitting group 220, in the present embodiment, the shape of the orthographic projection of the sub-structure 3 of the prism structure 30 on the substrate 1 may be adjusted with respect to the shape of a connection line between centers of the light emitting elements 2 in the light emitting group 200. For example, in a case that a connection line between the centers of the light emitting elements 2 in the first light emitting group 210 is of a rectangular shape, the orthographic projection of the sub-structure 3 of the prism structure 30 corresponding to the first light emitting group 210 on the substrate 1 may be of a rectangular annular structure. Or, in a case that a connection line between the centers of the light emitting elements 2 in the second light emitting group 220 is of a triangular shape, the orthographic projection of the sub-structure 3 of the prism structure 30 corresponding to the second light emitting group 220 on the substrate 1 may be of a "⊡" structure. That is, the shape of the connection line between the centers of the light emitting elements 2 in the light emitting group 200 and the shape of the orthographic projection of the sub-structure 3 of the corresponding prism structure 30 on the substrate 1 are not necessarily the same, and may be selected according to the actual situation.

16

Figure 22:
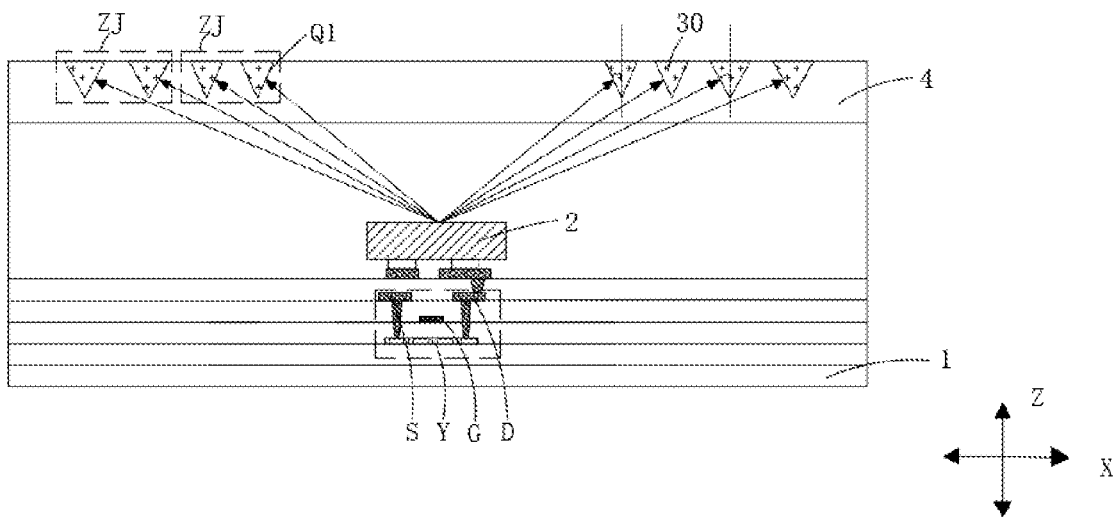
FIG. 22 is a structural view of film layers of a display panel according to yet another embodiment of the present disclosure.
Figure 23:
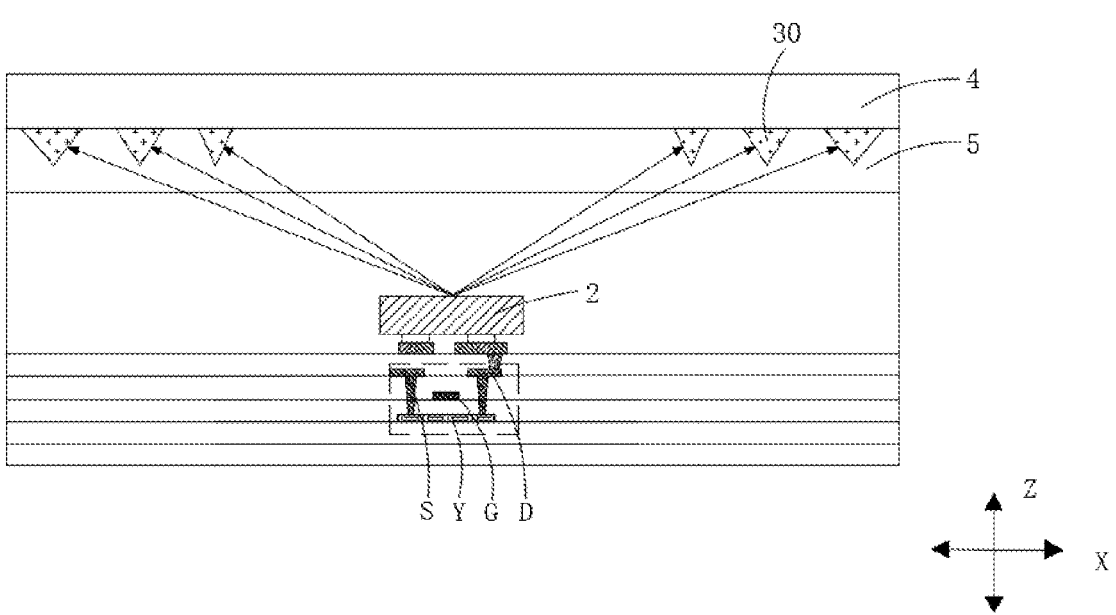
FIG. 23 is a structural view of film layers of a display panel according to yet another embodiment of the present disclosure.

With reference to FIG. 22, FIG. 22 is a structural view of film layers of a display panel according to yet another embodiment of the present disclosure. In some embodiments, the prism structure 30 includes at least two sub-structure groups ZJ. Each sub-structure group ZJ includes at least two adjacent sub-structures 3. Included angles between first inclined surfaces Q1 of the sub-structures 3 in the same sub-structure group ZJ and the direction Z perpendicular to a plane in which the substrate 1 is located are the same. Included angles between first inclined surfaces Q1 of the sub-structures 3 in different sub-structure groups ZJ and the direction Z perpendicular to a plane in which the substrate 1 is located are different.

It should be noted that multiple sub-structures 3 having the same included angle between the first inclined surface Q1 and the direction Z perpendicular to the plane in which the substrate 1 is located are more convenient to prepare, effectively reducing the difficulty of preparation. The sub-structures 3 of the different sub-structure groups ZJ may be prepared separately and it is not required to differentially prepare for each sub-structure 3. The included angles α between the first inclined surfaces Q1 of the sub-structures 3 of the different sub-structure groups ZJ and the direction Z perpendicular to the plane in which the substrate 1 is located are different, to change the incidence angles and corresponding refraction angles of the light emitting element 2 at the first inclined surfaces Q1 of the sub-structures 3 in different sub-structure groups ZJ, changing the incidence angle R of the light emitted from the light emitting element 2 on the display surface of the display panel.

With reference to FIG. 1, in some embodiments, the display panel further include a cover plate 4. The cover plate 4 is arranged on one side, away from the substrate 1, of the light emitting element 2, and has a first surface F1 and a second surface F2 nearer to the substrate 1 relative to the first surface F1. The multiple prism structures 30 are arranged within the cover plate 4, and each of the prism structures has a refractive index less than that of the cover plate 4.

In this embodiment, the refractive index of the prism structure 30 is less than the refractive index of the cover plate 4. That is, the cover plate 4 is an optically denser medium, and the prism structure 30 is an optically thinner medium. In this embodiment, since the prism structure 30 is arranged in the cover plate 4, the light emitted from the light emitting element 2 is incident from the cover plate 4 to the prism structure 30, i.e., is incident from an optically denser medium to an optically thinner medium. The incidence angle of the light emitted from the light emitting element 2 at the first inclined surface Q1 of the prism structure 30 is less than the refraction angle, to correspondingly reduce the incidence angle R of the light emitted from the prism structure 30 on the first surface F1 of the cover 4, i.e., on the display surface of the display panel, avoiding total reflection.

In an embodiment, a surface, away from the substrate 1, of the prism structure 30 is flush with the first surface F1. That is, the light emitted from the prism structure 30 can be directly directed to the outside without passing through other film layers, to facilitate adjustment of the incidence angle of the light emitted from the light emitting element 2 on the first surface F1 through the prism structure 30.

In addition to the form in which the prism structures 30 are arranged in the cover plate 4, the prism structures 30 may be arranged in other film layers. For example, with reference to FIG. 23, which is a structural view of film layers of a display panel according to yet another embodiment of the present disclosure, the display panel further includes a cover plate 4. The cover plate 4 is arranged on one side, away from the substrate 1, of the light emitting element 2. The cover plate 4 has a first surface F1 and a second surface F2 nearer to the substrate 1 relative to the first surface F1. The prism structures 30 are arranged within an intermediate film layer 5 between the cover plate 4 and the light emitting element 2, and each of the prism structures has a refractive index less than that of the intermediate film layer 5.

The intermediate film layer 5 may be made of a transparent material, such as an organic adhesive layer. In this embodiment, it is required to limit the refractive index of the prism structure 30 to be less than the refractive index of the intermediate film layer 5. The light emitted from the light emitting element 2 is incident from the intermediate film layer 5 into the prism structure 30, i.e., from the optically denser medium into the optically thinner medium. The incidence angle of the light emitted from the light emitting element 2 at the first inclined surface Q1 of the prism structure 30 is less than the refraction angle, and the incidence angle of the light emitted from the light emitting element 2 at the first inclined surface Q1 of the prism structure 30 is less than the refraction angle.

In an embodiment, the intermediate film layer 5 may refer to the conventional OCA (Optically Clear Adhesive) of the display panel, or may be a one-film layer provided additionally.

In an embodiment, the display panel further includes an encapsulation layer arranged between the intermediate film layer 5 and the light emitting element 2, and an OCA adhesive layer arranged between the intermediate film layer 5 and the cover plate 4. According to the actual need, a touch layer may further be arranged between the encapsulation layer and the intermediate film layer 5 to realize the touch function.

Figure 24:
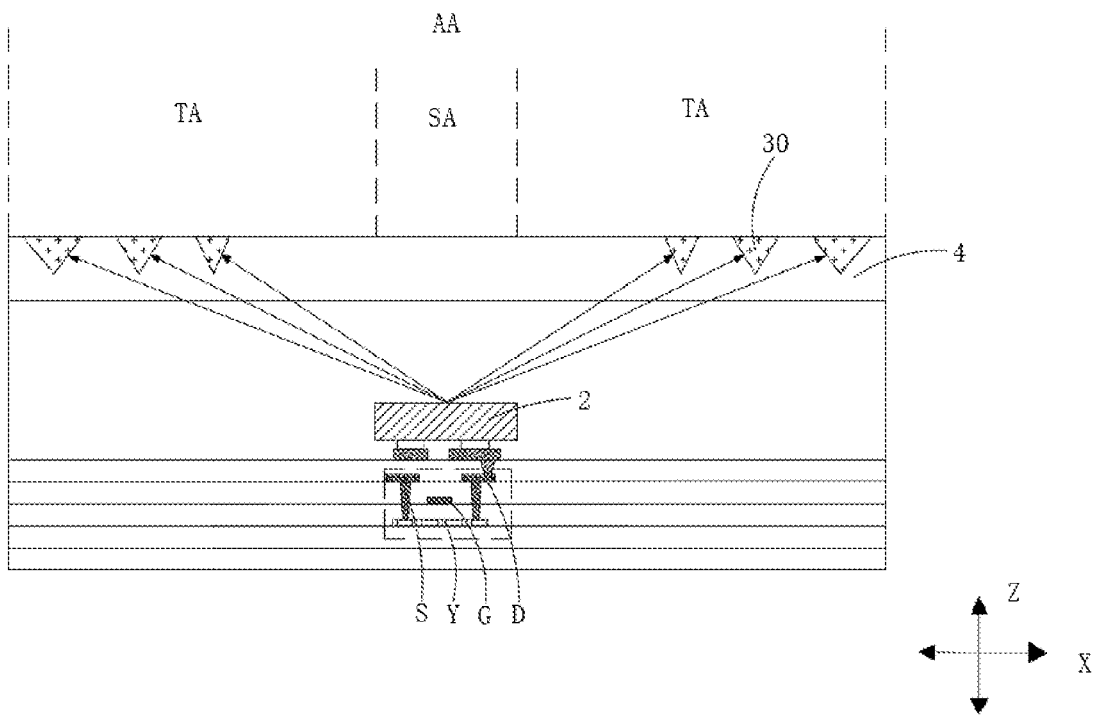
FIG. 24 is a structural view of film layers of a display panel according to yet another embodiment of the present disclosure.

With reference to FIG. 24, FIG. 24 is a schematic structural view of a display panel according to an embodiment of the present disclosure. In some embodiments, the display panel has a display region AA. The display region AA has a light emitting element arrangement region SA and a light-transmitting region TA adjacent to each other. The light emitting element arrangement region SA is a region used for arranging the light emitting elements 2, and the prism structures 30 may be arranged in the light-transmitting region TA. No prism structures need to be provided in the light emitting element arrangement region SA to avoid affecting the light emitting efficiency of the light emitting element 2 in the light emitting element arrangement region SA. The display panel including the light-transmitting region TA may be used for transparent display, i.e., the display panel may be used for displaying a screen, and objects located at the back of the display panel may be seen through the light-transmitting region TA.

Figure 25:
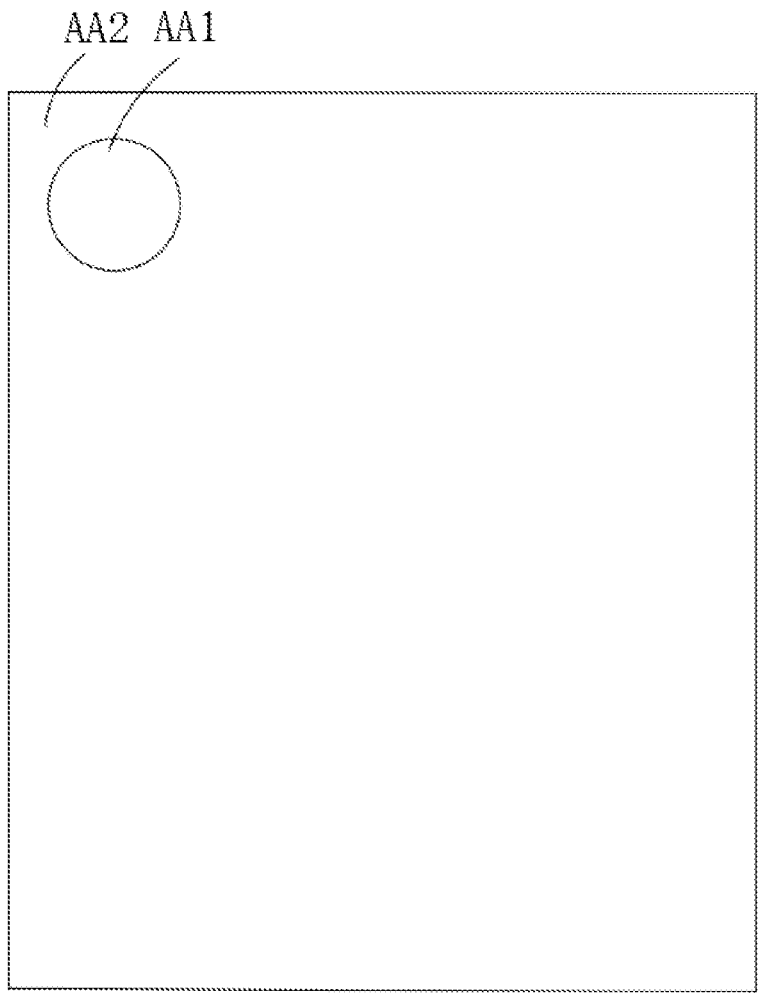
FIG. 25 is a schematic structural view of a display panel according to an embodiment of the present disclosure.

With reference to FIG. 25, FIG. 25 is a schematic structural view of a display panel according to an embodiment of the present disclosure. In some embodiments, the display panel has a first display region AA1 and a second display region AA2 adjacent to each other. The light transmittance of the first display region AA1 is greater than the light transmittance of the second display region AA2. The first display region AA1 may be used for arranging optical elements such as a camera, a fingerprint recognition element, and other elements that have a certain demand for light intake. In an embodiment, the prism structures 30 are arranged at least in the first display region AA1 to increase the amount of light emitted from the first display region AA1, improve the light emitting efficiency, and ensure the display effect of the first display region AA1. In one embodiment, the prism structures 30 may be arranged in both the first display region AA1 and the second display region AA2 to ensure that each region of the entire display panel is able to increase the amount of emitted light, improve the light emitting efficiency, and improve the display effect of the display panel.

Figure 26:
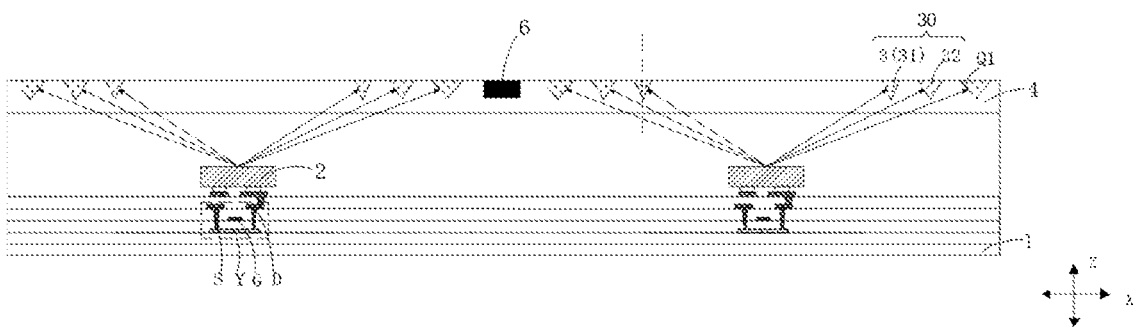
FIG. 26 is a structural view of film layers of a display panel according to yet another embodiment of the present disclosure.

With reference to FIG. 26, FIG. 26 is a structural view of film layers of a display panel according to yet another embodiment of the present disclosure. In some embodiments, a light-shielding structure 6 is arranged between adjacent prism structures 30 in the first direction X, to use the light-shielding structure 6 to block the light emitted from the light emitting element 2 from propagating laterally between the adjacent prism structures 30, to prevent the generation of a halo. The light-shielding structure 6 may achieve the effect of blocking and absorbing light by including an ink layer or other light-absorbing material.

A display device is further provided according to an embodiment of the present disclosure. The display device includes the display panel according to any one of the above embodiments. Therefore, the display device according to the embodiments of the present disclosure has the embodiments of the display panel according to any one of the above embodiments, and the same or corresponding structure as the above embodiments as well as the explanation of the terms will not be repeated herein. The display device according to the embodiments of the present disclosure may be a mobile phone, or any electronic product with a display function, including, but not limited to: a television set, a laptop computer, a desktop monitor, a tablet computer, a digital camera, a smart bracelet, smart glasses, an in-vehicle display, a medical device, an industrial control device, a touch interaction terminal, and the like.

The above embodiments are only some embodiments of the present disclosure. For convenience and simplicity of description, the specific operation processes of the above-described system, module and unit are not described here, and may be referred to the corresponding processes in the foregoing method embodiments. It should be understood that the scope of protection of the present disclosure is not limited thereto.

It is also to be noted that the exemplary embodiments mentioned in the present disclosure describe some methods or systems based on a series of steps or devices. However, the present disclosure is not limited to the order of the steps mentioned above. That is, the steps may be performed in the order mentioned in the embodiments, or in a different order than in the embodiments, or several steps may be performed simultaneously.

What is claimed is:

1. A display panel, comprising:

a substrate;

a plurality of light emitting elements arranged on one side of the substrate; and a plurality of prism structures arranged on a light emitting side of a light emitting element of the plurality of the light emitting elements, wherein a prism structure of the plurality of the prism structures comprises a plurality of sub-structures, an orthographic projection of each of the sub-structures on the substrate at least partially surrounds an orthographic projection of the light emitting element on the substrate, each of the sub-structures has a first inclined surface facing towards the light emitting element, and the sub-structures comprise a first sub-structure and a second sub-structure, wherein a distance between the first sub-structure and the light emitting element in a first direction is different from a distance between the second sub-structure and the light emitting element in the first direction, and an included angle between the first inclined surface of the first sub-structure and a direction perpendicular to a plane in which the substrate is located in the first direction is different from an included angle between the first inclined surface of the second sub-structure and the direction perpendicular to the plane in which the substrate is located in the first direction, wherein the first direction is parallel to the plane in which the substrate is located.

2. The display panel according to claim 1, wherein the distance between the first sub-structure and the light emitting element in the first direction is a first distance, the distance between the second sub-structure and the light emitting element in the first direction is a second distance, the included angle between the first inclined surface of the first sub-structure and the direction perpendicular to a plane in which the substrate is located in the first direction is a first included angle, and the included angle between the first inclined surface of the second sub-structure and the direction perpendicular to a plane in which the substrate is located in the first direction is a second included angle, wherein the first distance is less than the second distance, and the first included angle is less than the second included angle.

3. The display panel according to claim 2, wherein a width of the first sub-structure in the first direction is a first width and a width of the second sub-structure in the first direction is a second width, wherein the first width is less than or equal to the second width; or a depth of the first sub-structure is a first depth and a depth of the second sub-structure is a second depth, wherein the first depth is less than or equal to the second depth.

4. The display panel according to claim 1, wherein a distance between each two adjacent ones of the sub-structures of the prism structure in the first direction is equal; or a distance between each two adjacent ones of the sub-structures of the prism structure in the first direction increases sequentially along a direction away from the light emitting element; or a sub-structure, adjacent to the light emitting element, of the sub-structures of the prism structure is an inner sub-structure, and a distance between the inner sub-structure and the light emitting element in the first direction is greater than or equal to 0.5 millimeters; or a cross-section of each of the sub-structures increases sequentially along a direction away from the substrate; or a cross-section of each of the sub-structures on a plane perpendicular to the substrate is of at least one of an inverted triangle shape, a semicircle shape and an inverted trapezoid shape; or a shape of an outer edge of the orthographic projection of each of the sub-structures on the substrate is similar to a shape of the orthographic projection of the light emitting element on the substrate; or the orthographic projection of each of the sub-structures on the substrate is of a closed-ring shape and surrounds the orthographic projection of the light emitting element on the substrate.

5. The display panel according to claim 1, wherein the light emitting element comprises a first side extending in the first direction and a second side extending in a second direction, wherein a length of the first side is greater than a length of the second side, and the first direction and the second direction intersect with each other; and the prism structure comprises a first region adjacent to the first side and a second region adjacent to the second side, wherein a distribution density of ones, arranged in the first region, of the sub-structures is greater than a distribution density of ones, arranged in the second region, of the sub-structures.

6. The display panel according to claim 1, wherein an orthographic projections of the sub-structures of one prism structure on the substrate surround the orthographic projection of one light emitting element on the substrate.

7. The display panel according to claim 1, wherein the light emitting elements comprise a first light emitting element and a second light emitting element, light emitted from the first light emitting element has a wavelength greater than a wavelength of light emitted from the second light emitting element, a prism structure surrounding the first light emitting element is a first prism structure, and a prism structure surrounding the second light emitting element is a second prism structure;

a spacing between the first prism structure and the first light emitting element in the first direction is a first spacing, and a spacing between the second prism structure and the second light emitting element in the first direction is a second spacing; wherein the first spacing is less than the second spacing.

8. The display panel according to claim 1, wherein the light emitting elements comprise a first light emitting element and a second light emitting element, light emitted from the first light emitting element has a wavelength greater than a wavelength of light emitted from the second light emitting element, a prism structure surrounding the first light emitting element is a first prism structure, and a prism structure surrounding the second light emitting element is a second prism structure;

a sub-structure, adjacent to the first light emitting element, of the sub-structures of the first prism structure is a first inner sub-structure, and an included angle between a first inclined surface of the first inner sub-structure and the direction perpendicular to the plane in which the substrate is located in the first direction is a first inner included angle; and a sub-structure, adjacent to the second light emitting element, of the sub-structures of the second prism structure is a second inner sub-structure, and an included angle between a first inclined surface of the second inner sub-structure and the direction perpendicular to the plane in which the substrate is located in the first direction is a second inner included angle; wherein the first inner included angle is less than the second inner included angle.

9. The display panel according to claim 1, wherein the light emitting element comprises a first light emitting element and a second light emitting element, light emitted from the first light emitting element has a wavelength greater than a wavelength of light emitted from the second light emitting element, a prism structure surrounding the first light emitting element is a first prism structure, and a prism structure surrounding the second light emitting element is a second prism structure; and on one side of the light emitting element, the first prism structure is arranged in a first arrangement length in the first direction and the second prism structure is arranged in a second arrangement length in the first direction, wherein the first arrangement length is less than the second arrangement length.

10. The display panel according to claim 1, wherein the sub-structures of two adjacent prism structures are symmetrically arranged about a middle line between two light emitting elements surrounded by the two adjacent prism structures.

11. The display panel according to claim 1, wherein the sub-structure comprises a plurality of sub-sections spaced apart, wherein orthographic projections of the sub-sections on the substrate are symmetrically arranged about a center of the orthographic projection of the light emitting element on the substrate.

12. The display panel according to claim 11, wherein the sub-sections of different sub-structures are at least partially non-overlapped in a direction from a center of the light emitting element to the sub-structures.

13. The display panel according to claim 1, wherein at least two light emitting elements emitting light with different colors form a light emitting group; and the orthographic projection of each sub-structure of the plurality of the sub-structures of one prism structure on the substrate surrounds an orthographic projection of at least one light emitting group on the substrate.

14. The display panel according to claim 13, wherein the light emitting groups comprise a first light emitting group and a second light emitting group, and a connection line between centers of the light emitting elements in the first light emitting group has a different shape from a shape of a connection line between centers of the light emitting elements in the second light emitting group; and an orthographic projection of the sub-structure of a prism structure corresponding to the first light emitting group on the substrate has a different shape from a shape of an orthographic projection of the sub-structure of a prism structure corresponding to the second light emitting group on the substrate.

15. The display panel according to claim 13, wherein the prism structure comprises at least two sub-structure groups, wherein each of the sub-structure groups comprises at least two adjacent sub-structures, and included angles between first inclined surfaces of the sub-structures in the same sub-structure group and the direction perpendicular to the plane in which the substrate is located are the same; and included angles between first inclined surfaces of the sub-structures in different sub-structure groups and the direction perpendicular to the plane in which the substrate is located are different.

16. The display panel according to claim 1, further comprising a cover plate, wherein the cover plate is arranged on one side, away from the substrate, of the light emitting element, and the cover plate has a first surface and a second surface nearer to the substrate relative to the first surface; and the prism structures are arranged within the cover plate, and each of the prism structures has a refractive index less than a refractive index of the cover plate.

17. The display panel according to claim 16, wherein a surface, away from the substrate, of the prism structure is flush with the first surface.

18. The display panel according to claim 1, further comprising a cover plate, wherein the cover plate is arranged on one side, away from the substrate, of the light emitting element, and the cover plate has a first surface and a second surface nearer to the substrate relative to the first surface; and the prism structures are arranged within an intermediate film layer between the cover plate and the light emitting element, and each of the prism structures has a refractive index less than a refractive index of the intermediate film layer.

19. The display panel according to claim 1, wherein the display panel comprises a first display region and a second display region adjacent to each other, wherein the first display region has a light transmittance greater than a light transmittance of the second display region; and the prism structures are arranged at least in the first display region; or the included angle between the first inclined surface and the direction perpendicular to the plane in which the substrate is located ranges from 20 degrees to 60 degrees; or a light-shielding structure is arranged between adjacent prism structures in the first direction.

20. A display device comprising a display panel, wherein the display panel comprises:

a substrate;

a plurality of light emitting elements arranged on one side of the substrate; and a plurality of prism structures arranged on a light emitting side of the light emitting element, wherein the prism structure comprises a plurality of sub-structures, an orthographic projection of each of the sub-structures on the substrate at least partially surrounds an orthographic projection of the light emitting element on the substrate, each of the sub-structures has a first inclined surface facing towards the light emitting element, and the sub-structures comprise a first sub-structure and a second sub-structure, wherein a distance between the first sub-structure and the light emitting element in a first direction is different from a distance between the second sub-structure and the light emitting element in the first direction, and an included angle between the first inclined surface of the first sub-structure and a direction perpendicular to a plane in which the substrate is located in the first direction is different from an included angle between the first inclined surface of the second sub-structure and the direction perpendicular to the plane in which the substrate is located in the first direction, wherein the first direction is parallel to the plane in which the substrate is located.

* * * * *